United States Patent
Shu et al.

(10) Patent No.: US 12,389,764 B2
(45) Date of Patent: Aug. 12, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiaoqing Shu, Beijing (CN); Hongwei Ma, Beijing (CN); Xiangdan Dong, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 540 days.

(21) Appl. No.: 17/425,000

(22) PCT Filed: Apr. 26, 2020

(86) PCT No.: PCT/CN2020/087000
§ 371 (c)(1),
(2) Date: Jul. 22, 2021

(87) PCT Pub. No.: WO2021/217296
PCT Pub. Date: Nov. 4, 2021

(65) Prior Publication Data
US 2022/0320235 A1     Oct. 6, 2022

(51) Int. Cl.
*H10K 59/131*   (2023.01)
*H10K 59/122*   (2023.01)
*H10K 59/35*    (2023.01)

(52) U.S. Cl.
CPC ......... *H10K 59/131* (2023.02); *H10K 59/122* (2023.02); *H10K 59/352* (2023.02); *H10K 59/353* (2023.02)

(58) Field of Classification Search
CPC .. H10K 59/131; H10K 59/813; H10K 50/822; H10K 59/122; H10K 50/813; H10K 59/353; H10K 59/352
See application file for complete search history.

(56) References Cited

U.S. PATENT DOCUMENTS

| | | | |
|---|---|---|---|
| 11,569,311 B2 | 1/2023 | Liu et al. | |
| 2015/0200237 A1* | 7/2015 | Yim | H10K 59/131 257/40 |

(Continued)

FOREIGN PATENT DOCUMENTS

| | | |
|---|---|---|
| CN | 205355055 U | 6/2016 |
| CN | 108933155 A | 12/2018 |
| CN | 110265458 A | 9/2019 |

OTHER PUBLICATIONS

Extended European Search Report dated Apr. 24, 2023 received in European Patent Application No. EP 20926363.1.

(Continued)

*Primary Examiner* — Samuel A Gebremariam
*Assistant Examiner* — Jonas T Beardsley
(74) *Attorney, Agent, or Firm* — Scully, Scott, Murphy & Presser, P.C.

(57) ABSTRACT

A display substrate and a display device are provided. The display substrate includes a base substrate, a first power line and a pixel defining layer. The first power line includes first sub power lines and second sub power lines located between every two adjacent first sub power lines, the second sub power line is configured to connect two adjacent first sub power lines; the pixel defining layer includes a plurality of openings to define effective light-emitting regions of a (Continued)

plurality of sub-pixels. The plurality of sub-pixels include a first color sub-pixel, and the first color sub-pixel includes a first effective light-emitting region. The first sub power line includes a first break, and the first effective light-emitting region is located at the first break so that the first sub power line does not pass through the first effective light-emitting region in a first direction.

15 Claims, 8 Drawing Sheets

(56) References Cited

U.S. PATENT DOCUMENTS

| | | |
|---|---|---|
| 2018/0090553 A1* | 3/2018 | Rieutort-Louis .... H10K 59/353 |
| 2018/0277040 A1 | 9/2018 | Lee et al. |
| 2019/0140030 A1 | 5/2019 | Huangfu et al. |
| 2020/0312941 A1* | 10/2020 | Na ......................... H10K 50/10 |
| 2020/0411611 A1 | 12/2020 | Liu et al. |

OTHER PUBLICATIONS

First Office Action dated Nov. 25, 2024 for Chinese Patent Application No. 202080000601.6.

* cited by examiner

DISPLAY SUBSTRATE AND DISPLAY DEVICE

CROSS-REFERENCE TO RELATED APPLICATIONS

The present application is a national phase entry of PCT International Application No. PCT/CN2020/087000 filed on Apr. 26, 2020. The entire disclosure of PCT International Application No. PCT/CN2020/087000 is incorporated herein by reference in its entirety as part of the present application.

TECHNICAL FIELD

At least one embodiment of the present disclosure relates to a display substrate and a display device.

BACKGROUND

Organic light-emitting diodes have many advantages, such as self-illumination, high efficiency, bright colors, lightness, power saving, curlable, wide temperature range, etc., and have been gradually used in large-area display, lighting, vehicle-mounted display and other fields. In order to improve the uniformity of organic light-emitting diode display device, a two-layer power line structure can be adopted, and the power lines close to the light-emitting layer of the organic light-emitting diode form a grid pattern to reduce the voltage drop of the power line.

SUMMARY

At least one embodiment of the present disclosure provides a display substrate and a display device.

At least one embodiment of the present disclosure provides a display substrate, including: a base substrate; a first power line located on the base substrate and a pixel defining layer located on a side of the first power line away from the base substrate. The first power line includes a plurality of first sub power lines extending in a first direction and a plurality of second sub power lines located between every two adjacent first sub power lines, the second sub power line is configured to connect two adjacent first sub power lines; the pixel defining layer includes a plurality of openings to define effective light-emitting regions of a plurality of sub-pixels, the plurality of sub-pixels include a first color sub-pixel, and the first color sub-pixel includes a first effective light-emitting region. At least one of the first sub power lines includes at least one first break, and the first effective light-emitting region is located at the at least one first break so that the first sub power line does not pass through the first effective light-emitting region in the first direction.

For example, in an embodiment of the present disclosure, in a direction perpendicular to the base substrate, the first effective light-emitting region does not substantially overlap with the first sub power line having the first break.

For example, in an embodiment of the present disclosure, the display substrate further includes: a plurality o f second power lines extending in the first direction and located at a side of the first power lines close to the base substrate. The second power line is connected with the first power line through a via hole in an insulating layer between the first power line and the second power line.

For example, in an embodiment of the present disclosure, the plurality of sub-pixels further include a second color sub-pixel, and the second color sub-pixel includes a second effective light-emitting region; at least one of the first sub power lines includes at least one second break, and the second effective light-emitting region is located at the at least one second break so that the first sub power line does not pass through the second effective light-emitting region in the first direction.

For example, in an embodiment of the present disclosure, in a direction perpendicular to the base substrate, the second effective light-emitting region does not substantially overlap with the first sub power line having the second break.

For example, in an embodiment of the present disclosure, one of the first color sub-pixel and the second color sub-pixel is a blue sub-pixel, and the other is a red sub-pixel.

For example, in an embodiment of the present disclosure, the plurality of sub-pixels are divided into a plurality of repeating units, each of the plurality of repeating units includes the first color sub-pixel, the second color sub-pixel and two third color sub-pixels, and each of the third color sub-pixels includes a third effective light-emitting region, in each of the plurality of repeating units, the first color sub-pixel and the second color sub-pixel are arranged in the first direction, and two third color sub-pixels are arranged in a second direction intersecting with the first direction, and a first connection line connecting a center of the first color sub-pixel and a center of the second sub-pixel intersects with a second connection line connecting centers of the two third color sub-pixels, the plurality of repeating units are arranged in the second direction to form a plurality of repeating unit groups, the plurality of repeating unit groups are arranged in the first direction, and adjacent repeating unit groups among the plurality of repeating unit groups are shifted with each other in the second direction.

For example, in an embodiment of the present disclosure, the plurality of sub-pixels include the third color sub-pixel, and the third color sub-pixel includes a third effective light-emitting region; at least one of the first sub power lines includes at least one third break, and the third effective light-emitting region is located at the at least one third break so that the first sub power line does not pass through the third effective light-emitting region in the first direction.

For example, in an embodiment of the present disclosure, in a direction perpendicular to the base substrate, the third effective light-emitting region does not substantially overlap with the first sub power line having the third break.

For example, in an embodiment of the present disclosure, the display substrate further includes: a connection portion arranged in the same layer and made of the same material as the first power line. The third color sub-pixel includes a first electrode, an organic light-emitting layer and a second electrode which are sequentially stacked, the second electrode is located at a side of the organic light-emitting layer facing the base substrate and is electrically connected with the connection portion.

For example, in an embodiment of the present disclosure, the display substrate further includes: a strip-shaped portion, extending in the first direction, disposed in the same layer and made of the same material as the first power line. In a direction perpendicular to the base substrate, the third effective light-emitting region overlaps with both of the strip-shaped portion and the connection portion, and the strip-shaped portion is located between the second sub power line close to the third effective light-emitting region and the connection portion, and the strip-shaped portion and the connection portion are located at a same side of a straight line passing through a center of the third effective light-emitting region and extending in the first direction.

For example, in an embodiment of the present disclosure, the connection portion and the strip-shaped portion are of an integral structure.

For example, in an embodiment of the present disclosure, the display substrate includes: a pad block, extending in the first direction and is arranged in the same layer and made of the same material as the first power line. An orthographic projection of the third effective light-emitting region on the base substrate overlaps with an orthographic projection of the pad block on the base substrate, the strip-shaped portion and the connection portion are located at one side of the straight line passing through the center of the third effective light-emitting region and extending in the first direction, and the pad block is located at the other side of the straight line.

For example, in an embodiment of the present disclosure, in the direction perpendicular to the base substrate, a portion of each third effective light-emitting region overlapping with the pad block is a first overlapping portion, and a portion of the third effective light-emitting region overlapping with the connection portion and the strip-shaped portion is a second overlapping portion, and an area ratio of the first overlapping portion to the second overlapping portion is approximately 0.9-1.1.

For example, in an embodiment of the present disclosure, in each repeating unit, the third effective light-emitting regions of two third color sub-pixels are symmetrically distributed relative to the first connection line, and in the direction perpendicular to the base substrate, an overlapping portion of all of the pad block, the connection portion and the strip-shaped portion with the third effective light-emitting region of one third color sub-pixel is a third overlapping portion, an overlapping portion of all of the pad block, the connection portion and the strip-shaped portion with the third effective light-emitting region of another third color sub-pixel is a fourth overlapping portion, and the third overlapping portion and the fourth overlapping portion are approximately symmetrically distributed relative to the first connection line.

For example, in an embodiment of the present disclosure, the pad block is a portion of the first sub power line overlapping with the third effective light-emitting region in the direction perpendicular to the base substrate.

For example, in an embodiment of the present disclosure, in each third color sub-pixel, the first overlapping portion and the second overlapping portion are centrally symmetrically distributed.

For example, in an embodiment of the present disclosure, the second sub power line and the strip-shaped portion are of an integrated structure, and the strip-shaped portion and the connection portion are arranged at intervals; in the direction perpendicular to the base substrate, the first sub power line overlaps with the third effective light-emitting region, the strip-shaped portion and the connection portion are located at one side of the straight line passing through the center of the third effective light-emitting region and extending in the first direction, and the first sub power line is located at the other side of the straight line.

For example, in an embodiment of the present disclosure, the first sub power line further includes a protruding portion, the protruding portion is located at a side of a first sub power line main body close to the connection portion connected with the third color sub-pixel and between the second sub power line close to the third effective light-emitting region and the connection portion, and the protruding portion and the connection portion are arranged at intervals; an orthographic projection of the third effective light-emitting region on the base substrate overlaps with orthographic projections of all of the first sub power line main body, the protruding portion and the connection portion on the base substrate, and a center of the orthographic projection of the third effective light-emitting region on the base substrate is located within the orthographic projection of the protruding portion on the base substrate.

For example, in an embodiment of the present disclosure, in each repeating unit, an area of one first effective light-emitting region is greater than an area of one third effective light-emitting region, and an area of one second effective light-emitting region is greater than an area of one third effective light-emitting region.

For example, in an embodiment of the present disclosure, an orthographic projection of the effective light-emitting region of each sub-pixel on the base substrate does not overlap with an orthographic projection of the second sub power line on the base substrate.

For example, in an embodiment of the present disclosure, an orthographic projection of the first sub power line on the base substrate at least partially overlaps with an orthographic projection of the second power line on the base substrate.

At least an embodiment of the present disclosure provides a display substrate including: a base substrate; an active semiconductor layer on the base substrate; a first insulating layer located at a side of the active semiconductor layer away from the base substrate; a first conductive layer located at a side of the first insulating layer away from the active semiconductor layer; a second insulating layer located at a side of the first conductive layer away from the first insulating layer; a second conductive layer located at a side of the second insulating layer away from the first conductive layer; a third insulating layer located at a side of the second conductive layer away from the second insulating layer; a third conductive layer located at a side of the third insulating layer away from the second conductive layer; a fourth insulating layer located at a side of the third conductive layer away from the third insulating layer; a fourth conductive layer located at a side of the fourth insulating layer away from the third conductive layer, wherein the fourth conductive layer includes a first power line, the first power line includes a plurality of first sub power lines extending in a first direction and a plurality of second sub power lines located between every two adjacent first sub power lines, the second sub power line is configured to connect two adjacent first sub power lines, and the third conductive layer includes a plurality of second power lines extending in the first direction; and a pixel defining layer located at a side of the first power line away from the base substrate, the pixel defining layer including a plurality of openings to define effective light-emitting regions of a plurality of sub-pixels, the plurality of sub-pixels including a first color sub-pixel, and the first color sub-pixel including a first effective light-emitting region. At least one of the first sub power lines includes at least one first break, and the first effective light-emitting region is located at the at least one first break so that the first sub power line does not pass through the first effective light-emitting region in the first direction.

At least an embodiment of the present disclosure provides a display device including the display substrate as mentioned above.

BRIEF DESCRIPTION OF THE DRAWINGS

In order to clearly illustrate the technical solutions of the embodiments of the disclosure, the drawings of the embodiments will be briefly described in the following; it is obvious

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Figure 1:
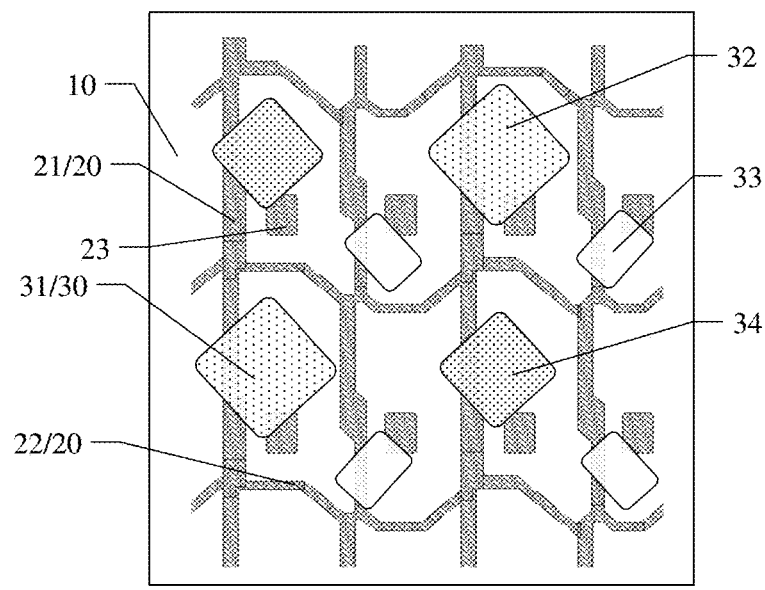
FIG. 1 is a schematic diagram of a partial planar structure of a display substrate.

FIG. 1 is a schematic diagram of a partial planar structure of a display substrate. As illustrated in FIG. 1, the display substrate includes a base substrate 10, a first power line 20 having a grid pattern, and an organic light-emitting element 30 located at a side of the first power line 20 away from the base substrate 10. The first power line 20 includes a first sub power line 21 extending in a first direction, and a plurality of second sub power lines 22 located between every two adjacent first sub power lines 21. The second sub power lines 22 are configured to connect two adjacent first sub power lines 21 so that the shape of the first power lines 20 is a grid pattern. The display substrate further includes a plurality of connection portions 23 arranged in the same layer as the first power line 20, and each connection portion 23 is configured to connect an anode of the organic light-emitting element 30 located at a side of the connection portion 23 away from the base substrate 10 with a light-emitting control transistor located at a side of the connection portion 23 close to the base substrate 10. The display substrate further includes a second power line, a data line and a gate line (not illustrated in the figure) located between the first power line 20 and the base substrate 10. The data line and the second power line are located at the same layer, and the second power line is electrically connected with the organic light-emitting element through the light-emitting control transistor, thereby providing a power signal for the organic light-emitting element. The extending direction of the second power line can be the same as the extending direction of the first sub power line, for example, both of the second power line and the first sub power line extend in the first direction. The orthographic projection of the first sub power line 21 extending in the first direction included in the first power line 20 on the base substrate 10 overlaps with the second power line so that the first power line 20 can be electrically connected with the second power line through a via hole in an insulating layer between the first power line 20 and the second power line. By arranging the first power line with the grid pattern and electrically connecting the first power line with the second power line, the above display substrate can reduce the voltage drop of the second power line, thereby improving the uniformity of the display device.

In the display substrate illustrated in FIG. 1, a pixel defining layer (not illustrated) is further provided on the side of the first power line 20 away from the base substrate 10, and the opening included in the pixel defining layer is used to define an effective light-emitting region in each color organic light-emitting element, and a light-emitting layer is provided in the effective light-emitting region. FIG. 1 schematically illustrates a light-emitting region 31 of an organic light-emitting element emitting light with each color. Respective organic light-emitting elements 30 include a blue organic light-emitting element 32, a green organic light-emitting element 33, and a red organic light-emitting element 34.

In the research, the inventor of the present application found that, as illustrated in FIG. 1, the effective light-emitting region 31 of the organic light-emitting element 30 emitting light of each color overlaps with the first sub power line 21 of the first power line 20. As a result, the surface of the light-emitting layer away from the base substrate is uneven because the film layers such as the light-emitting layer in the effective light-emitting region of the organic light-emitting element 30 cover the first power line 20, which in turn affects the display effect of pixels, resulting in color deviation and other defects. That is, the overlapping portion of the effective light-emitting region and the first sub power line is only located at one side of the center line of the effective light-emitting region extending in the first direction, which leads to the problem of asymmetry between two sides of the effective light-emitting region, which easily leads to color deviation.

In addition, the ratio of the overlapping area of the effective light-emitting region of the green organic light-emitting element 33 and the connection portion 23 to the area of the effective light-emitting region of the green organic light-emitting element is A, the ratio of the overlapping area of the effective light-emitting region of the red organic light-emitting element 34 and the connection portion 23 to the area of the effective light-emitting region of the red organic light-emitting element is B, and the ratio of the overlapping area of the effective light-emitting region of the blue organic light-emitting element 32 and the connection portion 23 to the area of the effective light-emitting region of the blue organic light-emitting element is C, A is greater than B and A is greater than C. Therefore, in addition to the influence of the first sub power line on the color deviation of the green organic light-emitting element, because the ratio of the overlapping area of the effective light-emitting region of the green organic light-emitting element and the connection portion to the area of the effective light-emitting region of the green organic light-emitting element is relatively large, the color deviation of the green organic light-emitting element is more obvious than that of the red organic light-emitting element and the blue organic light-emitting element.

Embodiments of the present disclosure provide a display substrate and a display device. The display substrate includes a base substrate, a first power line on the base substrate, and a pixel defining layer on a side of the first power line away from the base substrate. The first power lines include a plurality of first sub power lines extending in a first direction and a plurality of second sub power lines located between every two adjacent first sub power lines, and the second sub power line is configured to connect two adjacent first sub power lines. The pixel defining layer includes a plurality of openings to define effective light-emitting regions of a plurality of sub-pixels, the plurality of sub-pixels include a first color sub-pixel, the first color sub-pixel includes a first effective light-emitting region. At least one first sub power line includes at least one first break, and the first effective light-emitting region is located at the at least one first break so that the first sub power line does not pass through the first effective light-emitting region in the first direction. In the embodiment of the present disclosure, by arranging the first break on the first power line so that the first sub power line does not pass through the first effective light-emitting region of the first color sub-pixel, the flatness of the light-emitting layer of the first color sub-pixel can be improved, thereby solving the problem of color deviation.

The following describes the display substrate and the display device according to the embodiments of the present disclosure with reference to the accompanying drawings.

Figure 2:
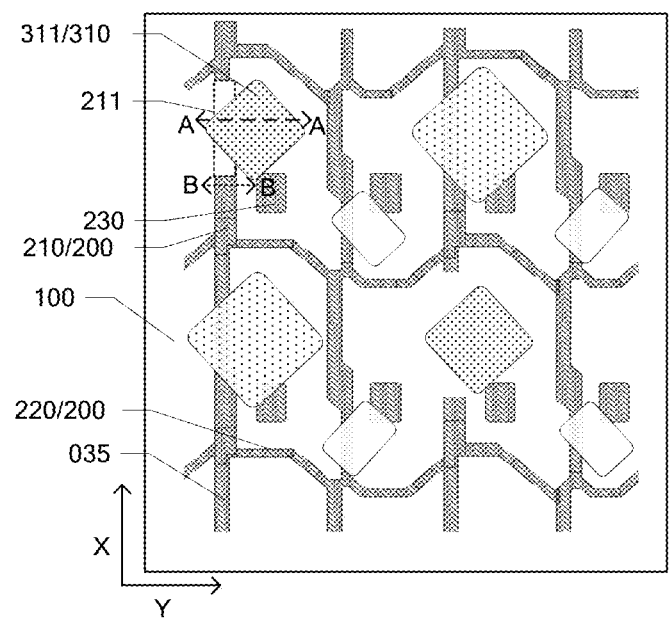
FIG. 2 is a schematic diagram of a partial planar structure of a display substrate according to an example of an embodiment of the present disclosure.

FIG. 2 is a schematic diagram of a partial planar structure of a display substrate according to an example of an embodiment of the present disclosure. As illustrated in FIG. 2, the display substrate includes a base substrate 100 and a first power line 200 located at the base substrate 100. The first power line 200 includes a plurality of first sub power lines 210 extending in a first direction (i.e., X direction), and a plurality of second sub power lines 220 located between every two adjacent first sub power lines 210, and the second sub power line 220 is configured to connect two adjacent first sub power lines 210, so that the shape of the first power lines 200 is approximately a grid pattern. For example, the first sub power lines 210 and the second sub power lines 220 are formed in the same patterning process using the same mask for the same metal material.

Figure 3:
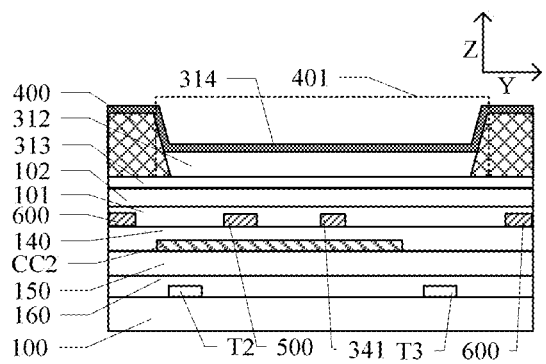
FIG. 3 is a schematic partial cross-sectional view taken along line AA illustrated in FIG. 2.
Figure 4:
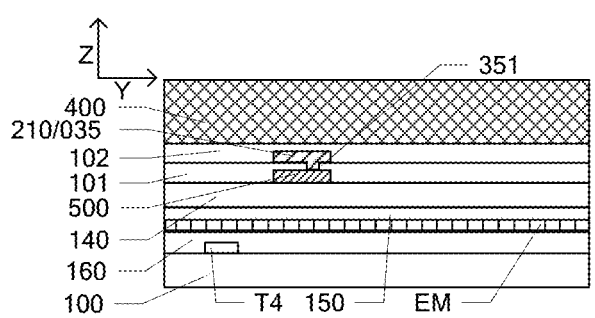
FIG. 4 is a schematic partial cross-sectional view taken along line BB illustrated in FIG. 2.

FIG. 3 is a schematic partial cross-sectional view taken along line AA illustrated in FIG. 2, and FIG. 4 is a schematic partial cross-sectional view taken along line BB illustrated in FIG. 2. As illustrated in FIG. 2 to FIG. 4, a pixel defining layer 400 is arranged on a side of the first power line 200 away from the base substrate 100, and the pixel defining layer 400 includes a plurality of openings 401 to define effective light-emitting regions of a plurality of sub-pixels. The plurality of sub-pixels include a first color sub-pixel 310, and the first color sub-pixel 310 includes a first effective light-emitting region 311.

For example, each sub-pixel includes a first electrode, an organic light-emitting layer and a second electrode which are sequentially stacked in the direction perpendicular to the base substrate. For example, the first color sub-pixel 310 includes a first electrode 314, an organic light-emitting layer 312 and a second electrode 313 located at the side of the organic light-emitting layer 312 facing the base substrate 100 which are sequentially stacked, and the portion where the organic light-emitting layer 312 is in contact with both of the first electrode 314 and the second electrode 313 can drive the organic light-emitting layer 312 to emit light. Therefore, the portion where the organic light-emitting layer 312 is in contact with both of the first electrode 314 and the second electrode 313 is the effective portion where the first color sub-pixel 310 can emit light, that is, the first effective light-emitting region 311. In an embodiment of the present disclosure, the shape of a sub-pixel can refer to the shape of a portion where the organic light-emitting layer is in contact with both of the first electrode and the second electrode. For example, for each sub-pixel, the area of the second electrode can be slightly greater than the area of the light-emitting layer, or the area of the light-emitting layer can be slightly greater than the area of the second electrode, which is not particularly limited by the embodiments of the present disclosure. For example, the light-emitting layer here can include the electroluminescent layer itself and other functional layers located at two sides of the electroluminescent layer, such as a hole injection layer, a hole transport layer, an electron injection layer and an electron transport layer and the like. In some embodiments, the shape of the pixel can also be defined by the shape of the opening of the pixel defining layer. For example, the second electrode of the light-emitting diode can be arranged below the pixel defining layer, and the pixel defining layer includes an opening for defining a pixel, the opening exposes a part of the second electrode. In the case where the organic light-emitting layer is formed in the opening in the pixel defining layer, two sides of the organic light-emitting layer are respectively in contact with the first electrode and the second electrode, so that the portion where the organic light-emitting layer is in contact with both of the first electrode and the second electrode can drive the organic light-emitting layer to emit light. Therefore, in this case, the opening of the pixel defining layer defines the shape of each sub-pixel.

For example, as illustrated in FIG. 2 to FIG. 4, an orthographic projection of the pixel defining layer 400 on the base substrate 100 overlaps with an orthographic projection of the first power line 200 on the base substrate 100, and at least part of an orthographic projection of the first effective light-emitting region 311 defined by the pixel defining layer 400 on the base substrate 100 does not overlap with the orthographic projection of the first power line 200 closest to the first effective light-emitting region 311 on the base substrate 100. The first effective light-emitting region 311 includes a center line extending in the X direction, and two first power lines 200 extending in the X direction are on two sides of the center line and adjacent to the center line, one of the two first power lines 200 which is closest to the center line is the above-mentioned first power line 200 closest to the first effective light-emitting region 311. For example, assuming that the first power line 200 closest to the first effective light-emitting region 311 is a continuous power line, the continuous power line will pass through the first effective light-emitting region.

As illustrated in FIG. 2 and FIG. 3, at least one first sub power line 210 included in the first power line 200 includes a first break 211, that is, the first sub power line 210 extending in the first direction of the first power line 200 is a discontinuous power line. The first effective light-emitting region 311 is located in the first break 211 so that the first sub power line 210 does not pass through the first effective light-emitting region 311 in the first direction. "The first effective light-emitting region is located at the first break" and "the first sub power line does not pass through the first effective light-emitting region in the first direction" described in the embodiments of the present disclosure refer to the positional relationship of the above features on the plane. For example, in the planar view illustrated in FIG. 2, the first effective light-emitting region is located in the first break, and the first sub power line does not pass through the first effective light-emitting region in the first direction.

For example, in an example of the embodiment of the present disclosure, in the direction perpendicular to the base substrate, the first effective light-emitting region can overlap with the first break and the first sub power line located at at least one side of the first break, that is, the first break is formed by removing a part of the structure of the first sub power line 21, the structure as mentioned above of the first sub power line is the overlapping portion between the first sub power line 21 and the effective light-emitting region of the blue organic light-emitting element 32 or the red organic light-emitting element 34 illustrated in FIG. 1, and by reducing the overlapping area between the first sub power line and the effective light-emitting region, the flatness of the organic light-emitting layer at the first break can be improved, which is beneficial to reducing color deviation.

For example, in another example of the embodiment of the present disclosure, in the direction perpendicular to the base substrate, the first effective light-emitting region and the first sub power line substantially do not overlap, that is, the first effective light-emitting region 311 overlaps with the center line of the first sub power line 210 extending in the first direction, but the overlapping position is provided with the first break 211, so the first effective light-emitting region 311 and the first sub power line 210 substantially do not overlap, and the flatness of the organic light-emitting layer 312 arranged in the first effective light-emitting region 311 can be improved, thereby preventing the color deviation of the first color sub-pixel 310 during the display process. The above-mentioned and subsequent "substantially do not overlap" means that the ratio of the area where the effective light-emitting region overlaps the first sub power line to the area of the effective light-emitting region does not exceed 5%. That is, compared with the situation illustrated in FIG. 1 that the first effective light-emitting region overlaps with the first sub power line, the embodiment of the present disclosure completely removes the overlapping position between the first sub power line and the first effective light-emitting region to form the first break, so that the first effective light-emitting region does not overlap with the first sub power line substantially, which can prevent the color deviation of the first color sub-pixel in the display process.

For example, as illustrated in FIG. 2, the shape of the first effective light-emitting region 311 can be a rectangle, and the extending direction of any side of the rectangle intersects with the first direction. The first effective light-emitting region 311 includes two first vertices opposite to each other and two second vertices opposite to each other. The orthographic projections of the two first vertices on the plane of the first sub power line 210 are located at two sides of the first sub power line 210, and the orthographic projections of the two second vertices on the plane of the first sub power line 210 are located at the same side of the first sub power line 210. The shape of the first effective light-emitting region illustrated in FIG. 2 can include strictly a sharp corner formed by two line segments, but in some embodiments, the shape of the first effective light-emitting region can be a rounded corner figure, such as a rounded corner rectangle. That is, the corners of the first effective light-emitting region are rounded. For example, in the case where the opening of the pixel defining layer is formed, the corner of the opening can form a rounded shape, so that the shape of the first effective light-emitting region has a rounded corner. The above-mentioned "vertices" can refer to the vertices among the four vertices of a standard rectangle with an included angle of 90 degrees, and can also refer to the points located at four rounded corners in a rounded rectangle, each rounded corner has one vertex.

For example, as illustrated in FIG. 2, in a second direction (Y direction) perpendicular to the first direction, the first effective light-emitting region 311 has a certain distance from the first sub power line 210 located at one side of the first effective light-emitting region and adjacent to it, and the first sub power line 210 located at the other side of the first effective light-emitting region 311 and adjacent to it is provided with the first break 211. Therefore, the first effective light-emitting region 311 does not overlap with the first sub power lines 210 on two sides thereof. The first sub power line 210 adjacent to the first effective light-emitting region 311 means that there is no other first sub power line 210 between the first sub power line 210 and the first effective light-emitting region 311.

For example, the maximum size of the first effective light-emitting region 311 in the second direction can be greater than the distance between two adjacent first sub power lines 210. At this time, by setting the first break 211 on at least one of the two adjacent first sub power lines 210 so that the first effective light-emitting region 311 is located at the first break 211, it can be prevented that the first effective light-emitting region 311 overlaps with the first sub power lines 210. Of course, the embodiment of the present disclosure does not specifically limit the maximum size of the first effective light-emitting region 311 in the second direction. For example, the maximum size of the first effective light-emitting region 311 in the second direction can also be less than or equal to the distance between two adjacent first sub power lines 210.

For example, as illustrated in FIG. 2, the orthographic projection of the first effective light-emitting region 311 on the base substrate 100 also does not overlap with the orthographic projection of the second sub power line 220 on the base substrate 100. For example, the maximum size of the first effective light-emitting region 311 in the first direction is less than the distance between two second sub power lines 220 located at two sides of the first effective light-emitting region 311 and adjacent to each other, so that the first effective light-emitting region 311 does not overlap with the second sub power lines 220.

In the display substrate according to an example of the embodiment of the present disclosure, the orthographic projection of the first effective light-emitting region 311 of the first color sub-pixel 310 on the base substrate 100 does not overlap with the first power line 200 to ensure the flatness of the organic light-emitting layer 312 and other film layers in the first effective light-emitting region 311, thereby preventing the first color sub-pixel from color deviation.

For example, the first color sub-pixel 310 can be a red sub-pixel, a blue sub-pixel or a green sub-pixel.

Figure 5:
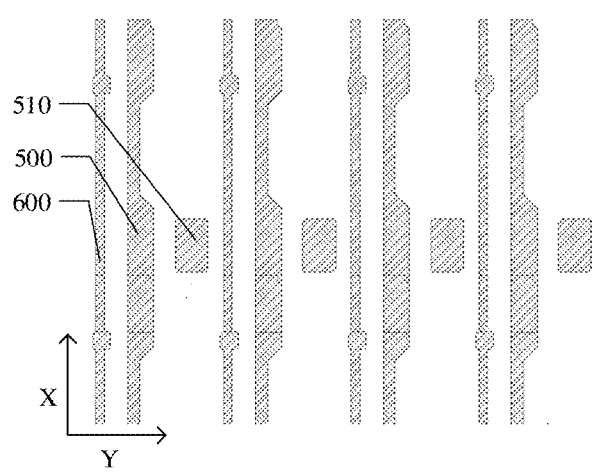
FIG. 5 is a schematic diagram of a partial planar structure of a second power line according to an embodiment of the present disclosure.

For example, FIG. 5 is a schematic diagram of a partial planar structure of a second power line according to an embodiment of the present disclosure. As illustrated in FIG. 2 to FIG. 5, the display substrate further includes a plurality of second power lines 500 located at a side of the first power line 200 close to the base substrate 100. The second power line 500 extends in the first direction and is configured to provide power signals to each sub-pixel.

For example, as illustrated in FIG. 2 to FIG. 5, the orthographic projection of the first sub power line 210 on the base substrate 100 at least partially overlaps with the orthographic projection of the second power line 500 on the base substrate 100, and the second power line 500 can be electrically connected with the first power line 200 through a via hole 351 in an insulating layer 101 (i.e., a fourth insulating layer 101 described later) between the first power line 200 and the second power line 500. For example, the position of the first sub power line 210 other than the break can substantially coincide with the second power line 500.

For example, as illustrated in FIG. 5, the display substrate further includes a data line 600 arranged in the same layer as the second power line 500, the data line 600 extends in the first direction and is configured to provide data signals for each sub-pixel. For example, the data line 600 can be formed by the same patterning process as the second power line 500. Here and later, "same layer" refers to the relationship between a plurality of film layers formed by the same material after the same step (such as one-step patterning process). Here, "same layer" does not always mean that the thickness of the plurality of film layers is the same or the height of the plurality of film layers in cross-sectional view is the same.

Figure 6A:
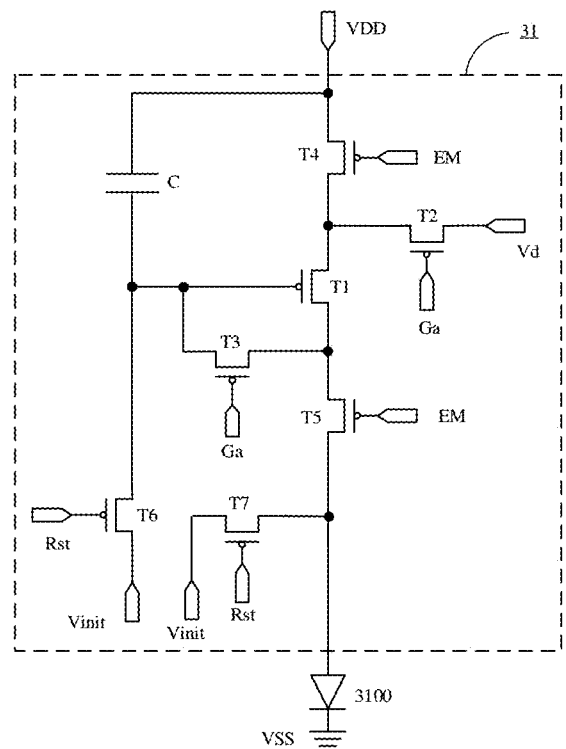
FIG. 6A is a schematic diagram of a pixel circuit of a first color sub-pixel according to an embodiment of the present disclosure.

For example, FIG. 6A is a schematic diagram of a pixel circuit of a first color sub-pixel according to an embodiment of the present disclosure. As illustrated in FIG. 6A, the pixel circuit 31 of the first color sub-pixel 310 can include a driving transistor T1, a data writing transistor T2, a threshold compensation transistor T3, a first light-emitting control transistor T4, a second light-emitting control transistor T5, a first reset transistor T6, a second reset transistor T7, and a storage capacitor C.

For example, the driving transistor T1 includes a gate electrode, a first electrode and a second electrode, and the driving transistor T1 is configured to supply a driving current for driving the first color organic light-emitting element 3100 to emit light.

For example, a first electrode of the data writing transistor T2 is electrically connected with the first electrode of the driving transistor T1, and is configured to write the data signal into the storage capacitor C under the control of a scanning signal; a second electrode of the data writing transistor T2 is configured to be electrically connected with the data line 600 to receive data signals, and a gate electrode of the data writing transistor T2 is configured to be electrically connected with a scanning signal line Ga to receive scanning signals; a first electrode of the storage capacitor C is electrically connected with a first power supply terminal VDD (e.g., a second power line 500), and a second electrode of the capacitor C is electrically connected with the gate electrode of the driving transistor T1, and is configured to store data signals.

For example, a first electrode of the threshold compensation transistor T3 is electrically connected with the second electrode of the driving transistor T1, and a second electrode of the threshold compensation transistor T3 is electrically connected with the gate electrode of the driving transistor T1, and the gate electrode of the threshold compensation transistor T3 is configured to be electrically connected with the scanning signal line Ga to receive a compensation control signal. A first electrode of the first reset transistor T6 is configured to be electrically connected with the reset power supply terminal Vinit to receive a reset signal, a second electrode of the first reset transistor T6 is electrically connected with the gate electrode of the driving transistor T1, and the gate electrode of the first reset transistor T6 is electrically connected with the reset control signal line Rst to receive a reset control signal. The first electrode of the second reset transistor T7 is electrically connected with the reset power supply terminal Vinit to receive a reset signal, the second electrode of the second reset transistor T7 is electrically connected with the first electrode of the first color organic light-emitting element 3100, and the gate electrode of the second reset transistor T7 is electrically connected with the reset control signal line Rst to receive a reset control signal. The first electrode of the first light-emitting control transistor T4 is electrically connected with the first power supply terminal VDD, the second electrode of the first light-emitting control transistor T4 is electrically connected with the first electrode of the driving transistor T1, and the gate electrode of the first light-emitting control transistor T4 is configured to be electrically connected with the light-emitting control signal line EM to receive light-emitting control signals; the first electrode of the second light-emitting control transistor T5 is electrically connected with the second electrode of the driving transistor T1, the second electrode of the second light-emitting control transistor T5 is electrically connected with the second electrode of the first color organic light-emitting element 3100, and the gate electrode of the second light-emitting control transistor T5 is configured to be electrically connected with the light-emitting control signal line EM to receive light-emitting control signals; the first electrode of the first color organic light-emitting element 3100 is electrically connected to the second power supply terminal VSS.

It should be noted that the transistors adopted in the embodiments of the present disclosure can be thin film transistors, field effect transistors or other switching devices with the same characteristics, and the thin film transistors can include oxide semiconductor thin film transistors, amorphous silicon thin film transistors or polysilicon thin film transistors, etc. The source electrode and drain electrode of the transistor can be symmetrical in structure, so the source electrode and drain electrode can be indistinguishable in physical structure. In the embodiment of the present disclosure, in order to distinguish transistors, except for the gate electrode as the control electrode, it is directly described that one of them is the first electrode and the other is the second electrode, so the first electrode and the second electrode of all or part of the transistors in the embodiment of the present disclosure can be interchanged as required.

It should be noted that, in the embodiment of the present disclosure, the pixel circuit of a sub-pixel can be a 7T1C structure (i.e., seven transistors and one capacitor) illustrated in FIG. 6A, and can also be a structure including other numbers of transistors, such as 7T2C structure, 6T1C structure, 6T2C structure or 9T2C structure, which is not limited by the embodiment of the present disclosure.

Figure 6B:
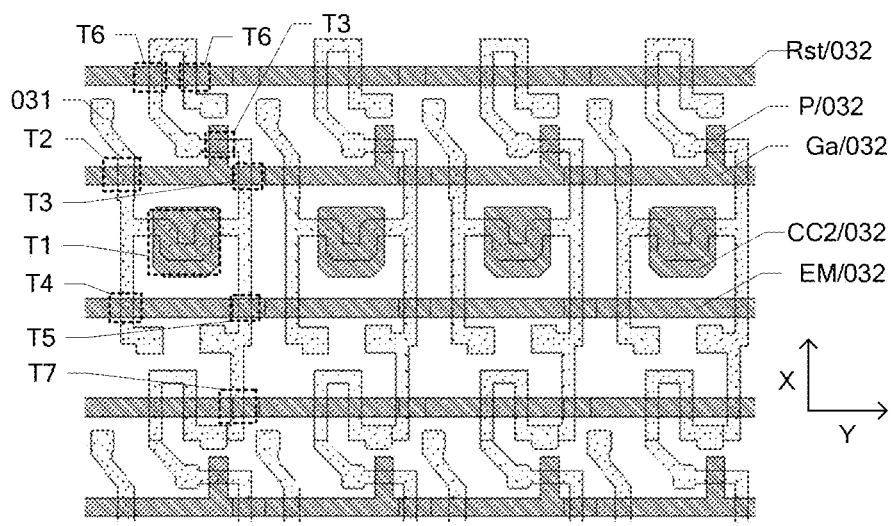
FIG. 6B to FIG. 6E are schematic diagrams of each layer of a pixel circuit according to an embodiment of the present disclosure.

FIG. 6B to FIG. 6E are schematic diagrams of each layer of a pixel circuit according to some embodiments of the present disclosure. The following describes the positional relationship of each circuit in the pixel circuit on the backplane with reference to FIG. 6B to FIG. 6E. The examples illustrated in FIG. 6B to FIG. 6E take the pixel circuits 31 that four sub-pixels adjacent to each other as an example, and illustrate the positions of the transistors of the pixel circuits included in one sub-pixel, and the components included in the pixel circuits in other sub-pixels are approximately the same as the positions of the transistors included in this sub-pixel. As illustrated in FIG. 6B, the pixel circuit 31 of this sub-pixel includes the driving transistor T1, the data writing transistor T2, the threshold compensation transistor T3, the first light-emitting control transistor T4, the second light-emitting control transistor T5, the first reset transistor T6, the second reset transistor T7, and the capacitor C illustrated in FIG. 6A.

For example, FIG. 6B illustrates the active semiconductor layer 031 of the pixel circuit in the display substrate. The active semiconductor layer 031 can be formed by patterning a semiconductor material. The active semiconductor layer 031 can be used to fabricate the active layers of the driving transistor T1, the data writing transistor T2, the threshold compensation transistor T3, the first light-emitting control transistor T4, the second light-emitting control transistor T5, the first reset transistor T6 and the second reset transistor T7 as mentioned above. The active semiconductor layer 031 includes active layer patterns (channel regions) and doped region patterns (source/drain doped regions) of each transistor of each sub-pixel, and the active layer patterns and doped region patterns of each transistor in the same pixel circuit are integrally arranged.

It should be noted that the active layer can include an integrally formed low-temperature polysilicon layer, and the source region and the drain region can be conductive by doping, etc. to realize the electrical connection of each structure. That is, the active semiconductor layer of each transistor in each sub-pixel is an integral pattern formed by p-silicon, and each transistor in the same pixel circuit includes a doped region pattern (i.e., a source region and a drain region) and an active layer pattern, and the active layers of different transistors are separated by doped structures.

For example, the active semiconductor layer 031 can be made of amorphous silicon, polysilicon, oxide semiconductor materials, and the like. It should be noted that the above-mentioned source region and drain region can be regions doped with n-type impurities or p-type impurities.

For example, the active semiconductor layers in the pixel circuits of different color sub-pixels arranged in the Y direction are disconnected from each other without a connection relationship. The active semiconductor layers in the pixel circuits of the sub-pixels arranged in the X direction can be integrated or disconnected from each other.

FIG. 6B to FIG. 6E also illustrate the scanning signal line Ga, the reset control signal line Rst, the reset power line Init of the reset power supply terminal Vinit, the light-emitting control signal line EM, the data line 600, the first power line 200, and the second power line 500 which are electrically connected to the pixel circuit 31 of each color sub-pixel. The first power line 200 and the second power line 500 are electrically connected to each other.

For example, the gate electrode metal layer of the pixel circuit can include a first conductive layer and a second conductive layer. A first insulating layer (the first insulating layer 160 illustrated in FIG. 3) is formed on the above-mentioned active semiconductor layer 031, to insulate the active semiconductor layer 031 from the gate electrode metal layer formed subsequently. FIG. 6B illustrates the first conductive layer 032 included in the display substrate, the first conductive layer 032 is arranged on the side of the first insulating layer 160 away from the active semiconductor layer 031, thereby being insulated from the active semiconductor layer 031. The first conductive layer 032 can include the second electrode CC2 of the capacitor C, the scanning signal line Ga, the reset control signal line Rst, the light-emitting control signal line EM, and the gate electrodes of the driving transistor T1, the data writing transistor T2, the threshold compensation transistor T3, the first light-emitting control transistor T4, the second light-emitting control transistor T5, the first reset transistor T6 and the second reset transistor T7.

For example, as illustrated in FIG. 6B, the gate electrode of the data writing transistor T2 can be a portion where the scanning signal line Ga overlaps with the active semiconductor layer 031; the gate electrode of the first light-emitting control transistor T4 can be a first portion where the light-emitting control signal line EM overlaps with the active semiconductor layer 031, and the gate electrode of the second light-emitting control transistor T5 can be a second portion where the light-emitting control signal line EM overlaps with the active semiconductor layer 031. The gate electrode of the first reset transistor T6 can be a first portion where the reset control signal line Rst overlaps with the active semiconductor layer 031, and the gate electrode of the second reset transistor T7 can be a second portion where the reset control signal line Rst overlaps with the active semiconductor layer 031. The threshold compensation transistor T3 can be a thin film transistor with a double gate structure, the first gate electrode of the threshold compensation transistor T3 can be a portion where the scanning signal line Ga overlaps with the active semiconductor layer 031, and the second gate electrode of the threshold compensation transistor T3 can be a portion where a protruding structure P protruding from the scanning signal line Ga overlaps with the active semiconductor layer 031. As illustrated in FIG. 6A and FIG. 6B, the gate electrode of the driving transistor T1 can be the second electrode CC2 of the capacitor C.

It should be noted that the dotted rectangular boxes in FIG. 6B illustrate the overlapping portions of the first conductive layer 032 and the active semiconductor layer 031. As the channel region of each transistor, the active semiconductor layers on two sides of each channel region are conductive by ion doping and other processes to form the first electrode and the second electrode of each transistor.

For example, as illustrated in FIG. 6B, the scanning signal lines Ga, the reset control signal lines Rst and the light-emitting control signal lines EM all extend in the second direction, and the scanning signal lines Ga, the reset control signal lines Rst and the light-emitting control signal lines EM are arranged in the first direction. The scanning signal line Ga is located between the reset control signal line Rst and the light-emitting control signal line EM.

For example, in the first direction, the second electrode CC2 of the capacitor C (i.e., the gate electrode of the driving transistor T1) is located between the scanning signal line Ga and the light-emitting control signal line EM. The protruding structure P protruding from the scanning signal line Ga is located at a side of the scanning signal line Ga away from the light-emitting control signal line EM.

For example, as illustrated in FIG. 6B, in the first direction, the gate electrodes of data writing transistor T2, the threshold compensation transistor T3 and the first reset transistor T6 are all located at the first side of the gate electrode of the driving transistor T1, and the gate electrodes of the first light-emitting control transistor T4, the second light-emitting control transistor T5 and the second reset transistor T7 are all located at the second side of the gate electrode of driving transistor T1. For example, in the example illustrated in FIG. 6B, the first side and the second side of the gate electrode of the driving transistor T1 of the pixel circuit of the sub-pixel are two opposite sides of the gate electrode of the driving transistor T1 in the first direction.

For example, in some embodiments, as illustrated in FIG. 6B, in the second direction, the gate electrode of the data writing transistor T2 and the gate electrode of the first light-emitting control transistor T4 are both located at the third side of the gate electrode of the driving transistor T1, and the first gate electrode of the threshold compensation transistor T3, the gate electrode of the second light-emitting control transistor T5 and the gate electrode of the second reset transistor T7 are all located at the fourth side of the gate electrode of the driving transistor T1. For example, in the example illustrated in FIG. 6B, the third side and the fourth side of the gate electrode of the driving transistor T1 of the pixel circuit of the sub-pixel are two opposite sides of the gate electrode of the driving transistor T1 in the second direction.

Figure 6C:
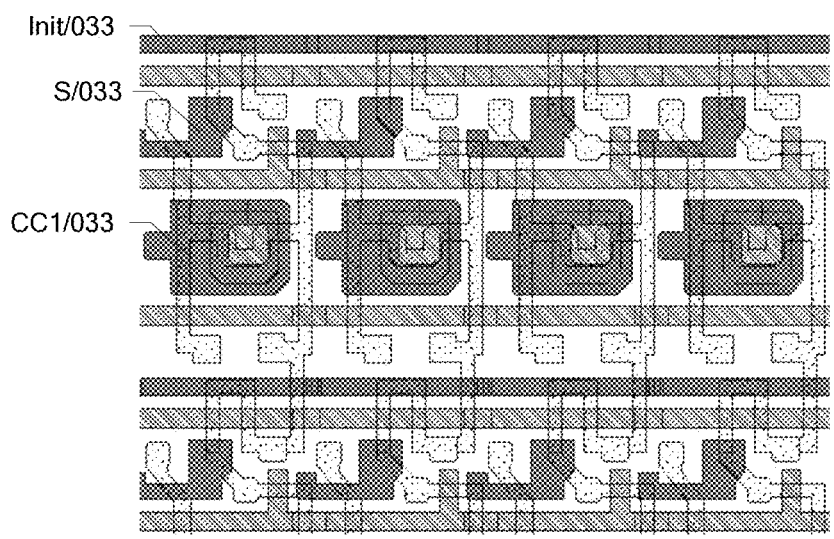

For example, a second insulating layer (such as the second insulating layer 150 illustrated in FIG. 3) is formed on the first conductive layer 032 to insulate the first conductive layer 032 from the second conductive layer 033 formed later. FIG. 6C illustrates the second conductive layer 033 of the pixel circuit, the second conductive layer 033 includes the first electrode CC1 of the capacitor C, the reset power line Init, and the light shielding portion S. The first electrode CC1 of the capacitor C at least partially overlaps with the second electrode CC2 of the capacitor C to form the capacitor C.

For example, as illustrated in FIG. 6C, the active semiconductor layer between two channels of the double-gate threshold compensation transistor T3 is in a floating state in the case where the threshold compensation transistor T3 is turned off, which is easily affected by the surrounding line voltage to jump, thus affecting the leakage current of the threshold compensation transistor T3 and further affecting the luminous brightness. In order to keep the voltage of the active semiconductor layer between the two channels of the threshold compensation transistor T3 stable, the light shielding portion S and the active semiconductor layer between the two channels of the threshold compensation transistor T3 are designed to form a capacitor, and the light shielding portion S can be connected to the first power line 200 to obtain a constant voltage, so the voltage of the active semiconductor layer in the floating state can be kept stable. The light shielding portion S overlaps with the active semiconductor layer between the two channels of the double-gate threshold compensation transistor T3, which can also prevent the active semiconductor layer between the two gate electrodes from being illuminated to change its characteristics, for example, to prevent the voltage of this part of the active semiconductor layer from changing to prevent crosstalk.

Figure 6D:
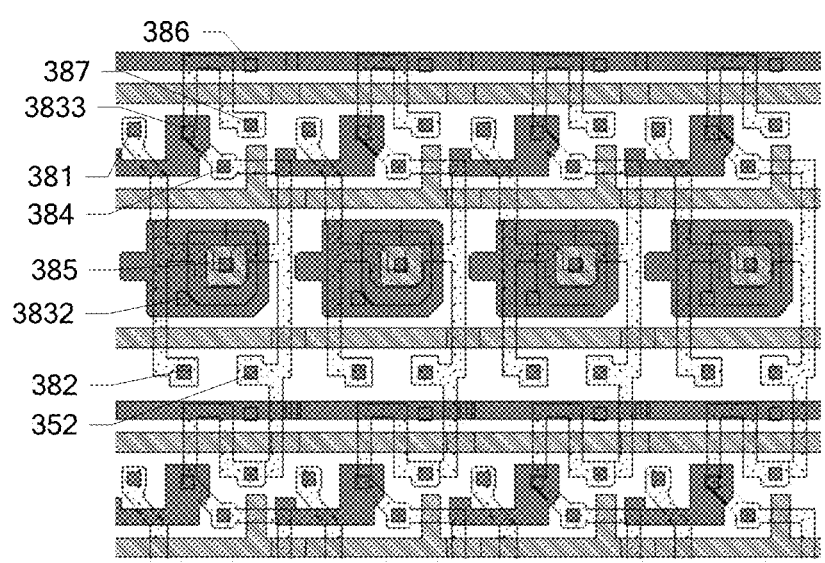
Figure 6E:
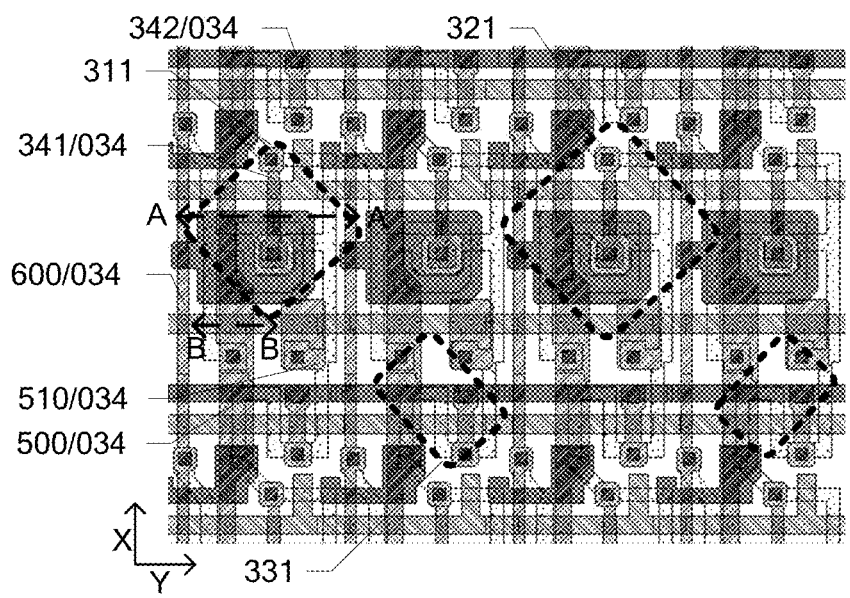

For example, a third insulating layer (such as the third insulating layer 140 illustrated in FIG. 3) is formed on the second conductive layer 033 to insulate the second conductive layer 033 from the third conductive layer 034 formed later. FIG. 6E illustrates a third conductive layer 034 of the pixel circuit, the third conductive layer 034 includes the data line 600 and the second power line 500. The data line 600 and the second power line 500 both extend in the first direction.

For example, the third conductive layer 034 further includes a first connection portion 341, a second connection portion 342 and a third connection portion 510. FIG. 6D and FIG. 6E also illustrate exemplary positions of a plurality of via holes, and the third conductive layer 034 is connected with a plurality of film layers located between the third conductive layer 034 and the base substrate through the illustrated plurality of via holes. For example, the data line 600 is electrically connected to the second electrode of the data writing transistor T2 through the via hole 381 penetrating through the first insulating layer 160, the second insulating layer 150, and the third insulating layer 140. The second power line 500 is electrically connected to the first electrode of the first light-emitting control transistor T4 through a via hole 382 penetrating through the first insulating layer 160, the second insulating layer 150 and the third insulating layer 140. The second power lines 500 and the data lines 600 are alternately arranged in the second direction. The second power line 500 is electrically connected to the first electrode CC1 of the storage capacitor through the via hole 3832 penetrating through the third insulating layer 140. The second power line 500 is electrically connected with the light shielding portion S through the via hole 3833 penetrating the second insulating layer 150 to provide a constant voltage to the light shielding portion S. One end of the first connection portion 341 is electrically connected with the second electrode of the threshold compensation transistor T3 through a via hole 384 penetrating through the first insulating layer 160, the second insulating layer 150 and the third insulating layer 140, and the other end of the first connection portion 341 is electrically connected with the gate electrode of the driving transistor T1 (i.e., the second electrode CC2 of the capacitor C) through a via hole 385 penetrating through the second insulating layer 150 and the third insulating layer 140. One end of the second connection portion 342 is electrically connected with the reset power line Init through a via hole 386 penetrating through the third insulating layer 140, and the other end of the second connection portion 342 is electrically connected with the first electrode of the second reset transistor T7 through a via hole 387 penetrating through the first insulating layer 160, the second insulating layer 150 and the third insulating layer 140. The third connection portion 510 is electrically connected to the second electrode of the second light-emitting control transistor T5 through a via hole 352 penetrating through the first insulating layer 160, the second insulating layer 150 and the third insulating layer 140.

For example, a fourth insulating layer (such as the fourth insulating layer 101 illustrated in FIG. 3) is formed on the third conductive layer 034 to insulate the third conductive layer 034 from the fourth conductive layer 035 (illustrated in FIG. 2) formed later. As illustrated in FIG. 6D and FIG. 4, the fourth insulating layer 101 includes a via hole 351, and the first sub power line 210 included in the fourth conductive layer 035 is electrically connected with the second power line 500 through the via hole 351.

FIG. 6E also illustrates a schematic diagram of the positional relationship between the effective light-emitting region of each color sub-pixel illustrated in FIG. 2 and the pixel circuit. To illustrate the positional relationship of each film layer conveniently, the film layer farthest from the base substrate illustrated in FIG. 6E is the film layer where the second power line is located, and FIG. 2 illustrates a schematic diagram of the positional relationship between the film layer where the first power line is located and the effective light-emitting region of the organic light-emitting element of each color sub-pixel. FIG. 3 is a schematic partial cross-sectional view of the organic light-emitting element of the first color sub-pixel, the first power lines, partial insulating layers in the structure illustrated in FIG. 2, and the second power lines and film layers between the second power lines and the base substrate in the structure illustrated in FIG. 6E taken along line AA; FIG. 4 is a schematic partial cross-sectional view of the organic light-emitting element of the first color sub-pixel, the first power lines, partial insulating layers in the structure illustrated in FIG. 2, and the second power lines and film layers between the second power lines and the base substrate in the structure illustrated in FIG. 6E taken along line BB.

For example, as illustrated in FIG. 2 to FIG. 6E, the display substrate further includes a fourth connection portion 230 arranged in the same layer as the first power line 200. For example, the material of the fourth connection portion 230 is the same as the material of the first power line 200. For example, the fourth connection portion 230 can be formed by the same patterning process as the first power line 200.

For example, a planarization layer 102 is arranged on the side of the fourth conductive layer 035 away from the third conductive layer 034, and the second electrode of the organic light-emitting element of each sub-pixel can be arranged on the side of the planarization layer 102 away from the base substrate 100, and the second electrode of the organic light-emitting element is electrically connected with the fourth connection portion 230 through the via hole in the planarization layer 102, and the fourth connection portion 230 is electrically connected with the third connection portion 510 through the via hole in the fourth insulating layer 101, thereby realizing the electrical connection between the second electrode of the organic light-emitting element and the second electrode of the second light-emitting control transistor T5. Embodiments of the present disclosure are not limited thereto, and for example, a passivation layer can be further disposed between the planarization layer and the fourth conductive layer.

In the display substrate provided by the embodiment of the present disclosure, the first power line and the second power line are electrically connected, which can reduce the voltage drop of the second power line, thereby improving the picture uniformity of the display device.

Figure 7:
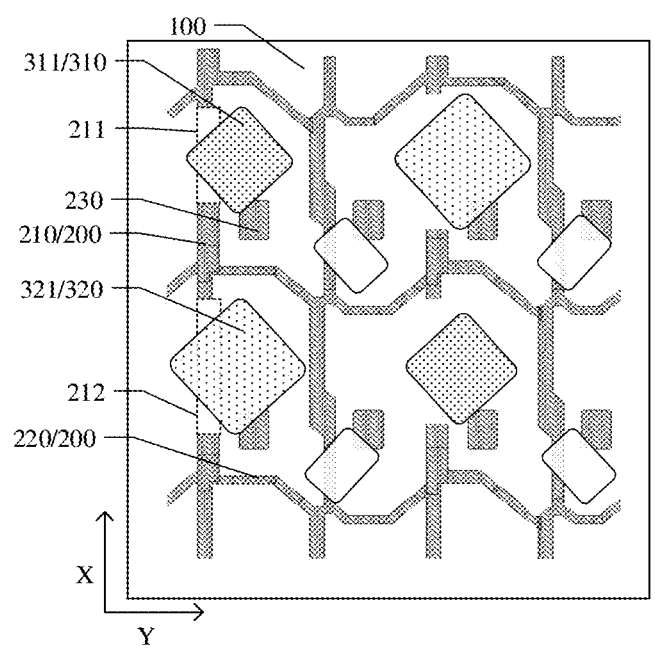
FIG. 7 is a schematic diagram of a partial planar structure of a display substrate according to another example of an embodiment of the present disclosure.

For example, FIG. 7 is a schematic diagram of a partial planar structure of a display substrate according to another example of the embodiment of the present disclosure. As illustrated in FIG. 7, the positional relationship between the first color sub-pixel 310 and the first sub power line 210 in the display substrate according to the embodiment of the present disclosure can be the same as the positional relationship between the first color sub-pixel 310 and the first sub power line 210 illustrated in FIG. 2. The plurality of sub-pixels included in the display substrate provided in this example also include a second color sub-pixel 320, and the second color sub-pixel 320 includes a second effective light-emitting region 321. For example, the second color sub-pixel 320 includes a first electrode, an organic light-emitting layer and a second electrode on the side of the organic light-emitting layer facing the base substrate 100 which are sequentially stacked. The portion where the organic light-emitting layer is in contact with both of the first electrode and the second electrode can drive the organic light-emitting layer to emit light. For example, the second electrode of the second color sub-pixel can be disposed below the pixel defining layer, the pixel defining layer includes an opening for defining pixels, the opening exposes a part of the second electrode. In the case where the organic light-emitting layer is formed in the opening in the pixel defining layer, two sides of the organic light-emitting layer are in contact with the first electrode and the second electrode respectively, so that the portion where the organic light-emitting layer is in contact with the first electrode and the second electrode is the effective portion of the second color sub-pixel, that is, the second effective light-emitting region 321.

For example, as illustrated in FIG. 7, the at least one first sub power line 210 included in the first power line 200 includes at least one second break 212, and the second effective light-emitting region 321 is located at the second break 212 so that the first sub power line 210 does not pass through the second effective light-emitting region 321 in the first direction. "The second effective light-emitting region is located at the second break" and "the first sub power line does not pass through the second effective light-emitting region in the first direction" described in the embodiments of the present disclosure refer to the positional relationship of the above features on the plane. For example, in the planar view illustrated in FIG. 7, the second effective light-emitting region is located at the second break, and the first sub power line does not pass through the second effective light-emitting region in the first direction.

For example, in an example of the embodiment of the present disclosure, in the direction perpendicular to the base substrate, the second effective light-emitting region can overlap with the second break and the first sub power line disposed on at least one side of the second break, that is, the second break is formed by removing a part of the structure of the first sub power line 21, the structure of the first sub power lines 21 overlaps with the effective light-emitting region of the blue organic light-emitting element 32 or the red organic light-emitting element 34 illustrated in FIG. 1, and by reducing the overlapping area between the first sub power line and the second effective light-emitting region, the flatness of the organic light-emitting layer at the second break can be improved, which is beneficial to reducing color deviation.

For example, in another example of the embodiment of the present disclosure, in the direction perpendicular to the base substrate, the second effective light-emitting region 321 does not substantially overlap with the first sub power line 210. The second effective light-emitting region 321 overlaps with the center line extending in the first direction of the first sub power line 210, but the overlapping position is provided with the second break 212, so the second effective light-emitting region 321 substantially does not overlap with the first sub power line 210, which can improve the flatness of the organic light-emitting layer and other film layers arranged in the second effective light-emitting region 321 to prevent the second color sub-pixel 320 from color deviation in the display process. That is, compared with the situation that the second effective light-emitting region overlaps with the first sub power line as illustrated in FIG. 1, the embodiment of the present disclosure completely removes the overlapping position of the first sub power line and the second effective light-emitting region to form the second break, so that the second effective light-emitting region does not overlap with the first sub power line substantially, which can prevent the color deviation of the second color sub-pixel in the display process.

For example, as illustrated in FIG. 7, the shape of the second effective light-emitting region 321 can be a rectangle, and the extending direction of any edge of the rectangle intersects with the first direction. The second effective light-emitting region 321 includes two third vertices opposite to each other and two fourth vertices opposite to each other. The orthographic projections of the two third vertices on the plane of the first sub power line 210 are located at two sides of the first sub power line 210, and the orthographic projections of the two fourth vertices on the plane of the first sub power line 210 are located at the same side of the first sub power line 210. The shape of the second effective light-emitting region illustrated in FIG. 7 can include strictly a sharp corner formed by two line segments, but in some embodiments, the shape of the second effective light-emitting region can be a rounded corner shape, such as a rounded corner rectangle. That is, the corners of the second effective light-emitting region are rounded. For example, in the case where the opening of the pixel defining layer is formed, the corner of the opening can form a rounded shape, so that the shape of the formed second effective light-emitting region can be rounded. The above-mentioned "vertices" can refer to the vertices among the four vertices of a standard rectangle with an included angle of 90 degrees, and can also refer to the points located at four rounded corners in a rounded rectangle, each rounded corner has one vertex.

For example, as illustrated in FIG. 7, in a second direction (Y direction) perpendicular to the first direction, the second effective light-emitting region 321 has a certain distance from the first sub power line 210 located at a side of the second effective light-emitting region and adjacent to it, and the first sub power line 210 located at the other side of the second effective light-emitting region 321 and adjacent to it is provided with the second break 212, so that the second effective light-emitting region 321 does not overlap with the first sub power lines 210 located at two sides thereof. The first sub power line 210 adjacent to the second effective light-emitting region 321 means that there is no other first sub power line 210 between the first sub power line 210 and the second effective light-emitting region 321.

For example, the maximum size of the second effective light-emitting region 321 in the second direction can be greater than the distance between two adjacent first sub power lines 210. At this time, by setting the second break 212 on at least one of the two adjacent first sub power lines 210 so that the second effective light-emitting region 321 is located at the second break 212, it can be prevented that the second effective light-emitting region 321 overlaps with the first sub power lines 210. Of course, the embodiment of the present disclosure does not specifically limit the maximum size of the second effective light-emitting region 321 in the second direction. For example, the maximum size of the second effective light-emitting region 321 in the second direction can be less than or equal to the distance between two adjacent first sub power lines 210.

For example, as illustrated in FIG. 7, the orthographic projection of the second effective light-emitting region 321 on the base substrate 100 also does not overlap with the orthographic projection of the second sub power line 220 on the base substrate 100. For example, the maximum dimension of the second effective light-emitting region 321 in the first direction is less than the distance between two second sub power lines 220 located at two sides of the second effective light-emitting region 321 and adjacent to each other, so that the second effective light-emitting region 321 does not overlap with the second sub power lines 220.

In the display substrate according to an example of the embodiment of the present disclosure, the orthographic projection of the second effective light-emitting region 321 of the second color sub-pixel 320 on the base substrate 100 does not overlap with the first power line 200 to ensure the flatness of the light-emitting layer and other film layers in the second effective light-emitting region 321, thereby preventing the second color sub-pixel from color deviation during display.

For example, one of the first color sub-pixel 310 and the second color sub-pixel 320 is a blue sub-pixel and the other is a red sub-pixel.

For example, the first color sub-pixel 310 can be a red sub-pixel and the second color sub-pixel 320 can be a blue sub-pixel, and the area of the first effective light-emitting region 311 of one first color sub-pixel 310 is less than the area of the second effective light-emitting region 321 of one second color sub-pixel 320 to prolong the service life of the display substrate.

For example, the pixel circuit structure included in the second color sub-pixel according to the embodiment of the present disclosure is the same as the pixel circuit structure included in the first color sub-pixel, and will not be described in detail here.

Figure 8:
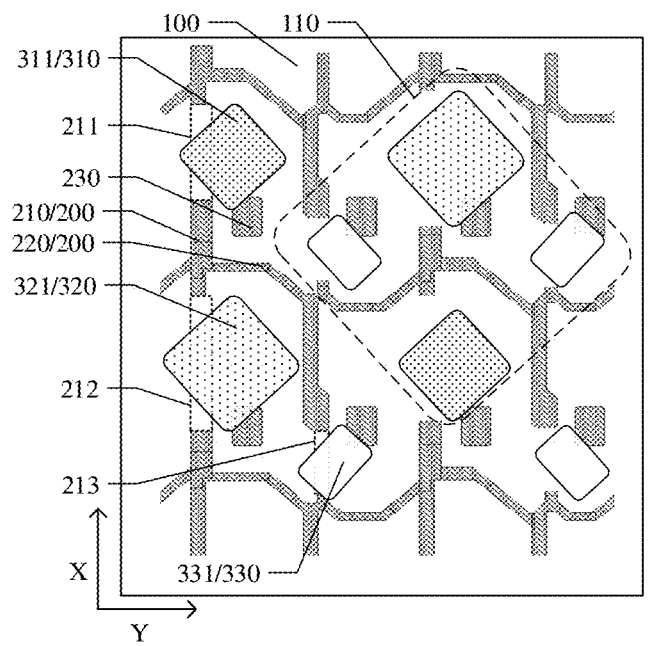
FIG. 8 is a schematic diagram of a partial planar structure of a display substrate according to another example of an embodiment of the present disclosure.

For example, FIG. 8 is a schematic diagram of a partial planar structure of a display substrate according to another example of the embodiment of the present disclosure. In this example, the positional relationship between the first color sub-pixel 310 and the first sub power line 210 and the positional relationship between the second color sub-pixel 320 and the first sub power line 210 can be the same as the example illustrated in FIG. 2 or the same as the example illustrated in FIG. 7, and this example is not limited thereto. This example schematically illustrates that the positional relationship between the second color sub-pixel 320 and the first sub power line 210 can be the same as the example illustrated in FIG. 7. As illustrated in FIG. 8, the plurality of sub-pixels further includes a third color sub-pixel 330, the third color sub-pixel 330 includes a third effective light-emitting region 331. The opening included in the pixel defining layer can be used to define the third effective light-emitting region 331.

For example, as illustrated in FIG. 8, at least one first sub power line 210 includes a third break 213, and the third effective light-emitting region 331 is located at the third break 213 so that the first sub power line 210 does not pass through the third effective light-emitting region 331 in the first direction. "The third effective light-emitting region is located at the third break" and "the first sub power line does not pass through the third effective light-emitting region in the first direction" described in the embodiments of the present disclosure refer to the positional relationship of the above features on the plane. For example, in the planar view illustrated in FIG. 8, the third effective light-emitting region is located at the third break, and the first sub power line does not pass through the third effective light-emitting region in the first direction.

For example, in an example of the embodiment of the present disclosure, in the direction perpendicular to the base substrate, the third effective light-emitting region can overlap with the third break and the first sub power line disposed on at least one side of the third break, that is, the third break is formed by removing a part of the structure of the first sub power line 21, the structure overlaps with the effective light-emitting region of the green organic light-emitting element 33 illustrated in FIG. 1, and by reducing the overlapping area between the first sub power line and the third effective light-emitting region, the flatness of the organic light-emitting layer at the third break can be improved, which is beneficial to reducing color deviation.

For example, in another example of the embodiment of the present disclosure, in the direction perpendicular to the base substrate, the third effective light-emitting region does not substantially overlap with the first sub power line 210. The third effective light-emitting region 331 overlaps with the center line extending in the first direction of the first sub power line 210, but the overlapping position between the center line and the third effective light-emitting region is provided with the third break 213, so the third effective light-emitting region 331 substantially does not overlap with the first sub power line 210, which can improve the flatness of the organic light-emitting layer and other film layers arranged in the third effective light-emitting region 331, thereby preventing the color deviation of the third color sub-pixel 330 in the display process. That is, compared with the situation that the third effective light-emitting region overlaps with the first sub power line as illustrated in FIG. 1, the embodiment of the present disclosure removes all the overlapping positions of the first sub power line and the third effective light-emitting region to form the third break, so that the third effective light-emitting region does not overlap with the first sub power line, which can prevent the third color sub-pixel from color deviation in the display process.

For example, as illustrated in FIG. 8, the orthographic projection of the third effective light-emitting region 331 on the base substrate 100 does not overlap with the orthographic projection of the second sub power line 220 on the base substrate 100. For example, the maximum size of the third effective light-emitting region 331 in the first direction is less than the distance between two second sub power lines 220 located at two sides thereof and adjacent to each other so that the third effective light-emitting region 331 does not overlap with the second sub power lines 220.

In the display substrate according to an example of the embodiment of the present disclosure, the orthographic projection of the third effective light-emitting region 331 of the third color sub-pixel 330 on the base substrate 100 does not overlap with the first power line 200 to ensure the flatness of the organic light-emitting layer and other film layers in the third effective light-emitting region 331, thereby preventing the third color sub-pixel from color deviation in the display process.

For example, one of the first color sub-pixel 310 and the second color sub-pixel 320 is a blue sub-pixel, the other is a red sub-pixel, and the third color sub-pixel 330 is a green sub-pixel.

For example, the area of the first effective light-emitting region 311 of each first color sub-pixel 310 and the area of the second effective light-emitting region 321 of each second color sub-pixel 320 both are greater than the area of the third effective light-emitting region 331 of each third color sub-pixel 330 to improve the service life of the display device.

For example, the pixel circuit structure included in the third color sub-pixel according to the embodiment of the present disclosure is the same as the pixel circuit structure included in the first color sub-pixel, and will not be described in detail here.

Figure 9:
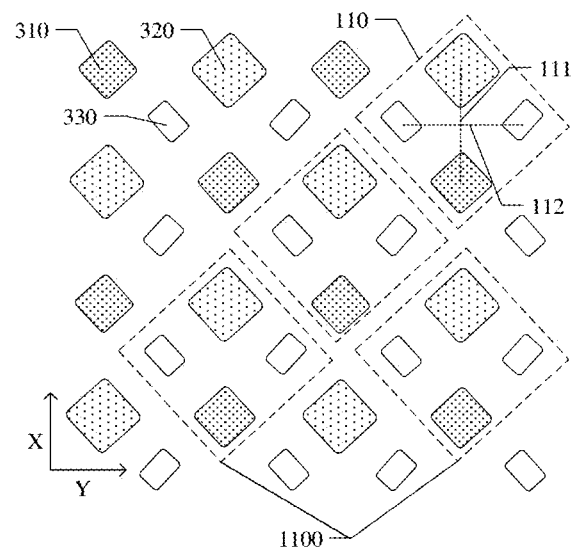
FIG. 9 is a partial structural diagram of pixel arrangement in the display substrate illustrated in FIG. 8.

For example, FIG. 9 is a partial structural diagram of the pixel arrangement in the display substrate illustrated in FIG. 8. As illustrated in FIG. 8 to FIG. 9, a plurality of sub-pixels are divided into a plurality of repeating units 110, and each repeating unit includes one first color sub-pixel 310, one second color sub-pixel 320 and two third color sub-pixels 330. In each repeating unit 110, the first color sub-pixel 310 and the second color sub-pixel 320 are arranged in the first direction (X direction), and two third color sub-pixels 330 are arranged in the second direction (Y direction) intersecting with the first direction. A first connection line 111 between the center of the first color sub-pixel 310 and the center of the second color sub-pixel 320 intersects with a second connection line 112 between the centers of the two third color sub-pixels 330. The plurality of repeating units 110 are arranged in the second direction to form a plurality of repeating unit groups 1100, the plurality of repeating unit groups 1100 are arranged in the first direction, and adjacent repeating unit groups 1100 in the plurality of repeating unit groups 1100 are shifted from each other in the second direction.

For example, as illustrated in FIG. 8 and FIG. 9, according to the arrangement of the first color sub-pixel 310, the second color sub-pixel 320 and the third color sub-pixel 330 in each repeating unit 110, the second sub power line 220 in the first power line 200 is set in a curved shape, so that the effective light-emitting region of each sub-pixel does not overlap with the second sub power line 220.

For example, as illustrated in FIG. 8 and FIG. 9, the first color sub-pixels 310 and the second color sub-pixels 320 are alternately arranged in the first direction, and the plurality of third color sub-pixels 330 are arranged in the first direction.

For example, as illustrated in FIG. 8 and FIG. 9, the plurality of first sub power lines 210 include first sub power lines 210 located in odd columns and first sub power lines 210 located in even columns The first sub power lines 210 located in odd columns include the first breaks 211 and the second breaks 212, and the first breaks 211 and the second breaks 212 are alternately arranged in the first direction. The first sub power line 210 located in the even column only includes the third break 213. The embodiment of the present disclosure is not limited thereto, and it can also be that the first sub power lines in odd columns only include the third breaks, and the first sub power lines in even columns include the first breaks and the second breaks.

For example, as illustrated in FIG. 8 and FIG. 9, the first color sub-pixels 310 and the second color sub-pixels 320 are alternately arranged in the second direction, so the first breaks 211 and the second breaks 212 respectively on the first sub power lines 210 of adjacent odd columns are alternately arranged in the second direction.

For example, as illustrated in FIG. 8 and FIG. 9, the plurality of third color sub-pixels 330 are arranged in the second direction, and therefore, the third breaks 213 on the first sub power lines 210 of adjacent even columns are arranged in the second direction.

Embodiments of the present disclosure are not limited to the arrangement of color sub-pixels illustrated in FIG. 9. For example, each color sub-pixel can be arranged in other pixel arrangements such as real RGB pixel arrangement and diamond pixel arrangement, as long as the first sub power line in the first power line does not pass through the effective light-emitting region of each sub-pixel in the first direction.

According to the embodiment of the present disclosure, by removing part of the first power lines on a side of the effective light-emitting region of each color sub-pixel facing the base substrate side, the flatness of the light-emitting layer and other film layers of each color sub-pixel can be ensured, thereby preventing color deviation of each color sub-pixel.

Figure 10A:
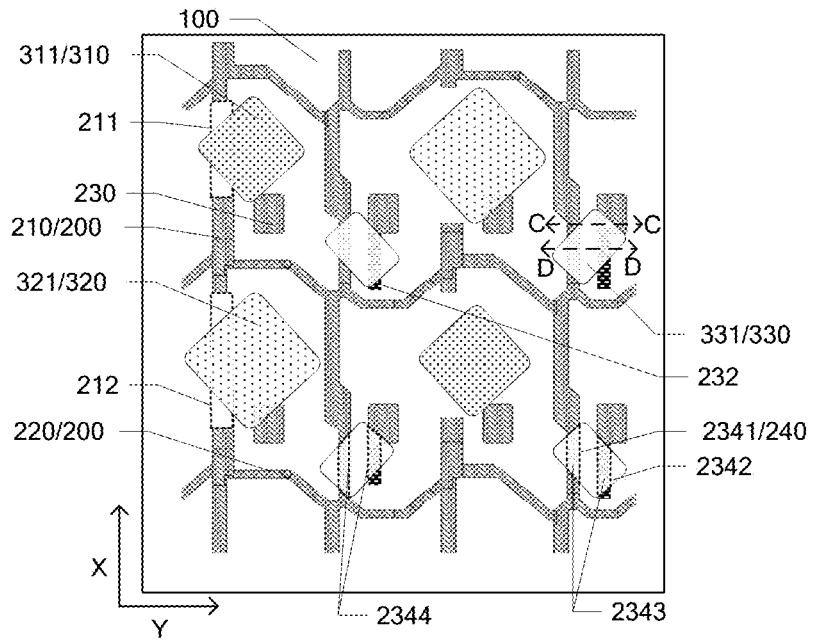
FIG. 10A is a schematic diagram of a partial planar structure of a display substrate according to another example of an embodiment of the present disclosure.
Figure 11:
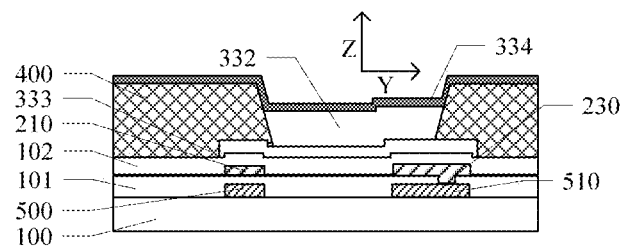
FIG. 11 is a cross-sectional view taken along line CC in the display substrate illustrated in FIG. 10A.
Figure 12:
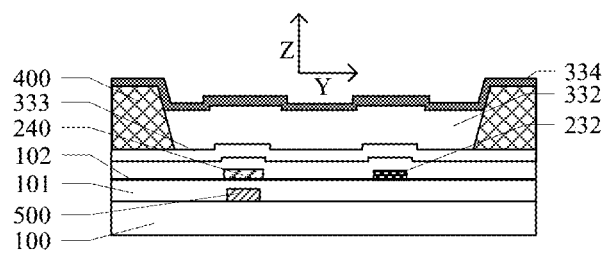
FIG. 12 is a cross-sectional view taken along line DD in the display substrate illustrated in FIG. 10A.

For example, FIG. 10A is a schematic diagram of a partial planar structure of a display substrate according to another example of the embodiment of the present disclosure, FIG. 11 is a cross-sectional view taken along line CC in the display substrate illustrated in FIG. 10A, and FIG. 12 is a cross-sectional view taken along line DD in the display substrate illustrated in FIG. 10A. In FIG. 11 and FIG. 12, film layers between the second power line and the base substrate are omitted. In this example, the positional relationship between the first color sub-pixel 310 and the first sub power line 210 and the positional relationship between the second color sub-pixel 320 and the first sub power line 210 can be the same as the example illustrated in FIG. 2 or the same as the example illustrated in FIG. 7, and this example is not limited thereto. This example schematically illustrates that the positional relationship between the second color sub-pixel 320 and the first sub power line 210 can be the same as the example illustrated in FIG. 7, and the arrangement of pixels in this example is the same as the arrangement of pixels illustrated in FIG. 9.

For example, as illustrated in FIG. 10A and FIG. 11 to FIG. 12, the third color sub-pixel 330 includes a first electrode 334, an organic light-emitting layer 332 and a second electrode 333 located at the side of the organic light-emitting layer 332 facing the base substrate 100, and the portion where the organic light-emitting layer 332 is in contact with both of the first electrode 334 and the second electrode 333 can drive the organic light-emitting layer 332 to emit light. The second electrode 333 is electrically connected with the fourth connection portion 230, and the orthographic projection of the third effective light-emitting region 331 on the base substrate 100 overlaps with the orthographic projection of the fourth connection portion 230 on the base substrate 100.

For example, as illustrated in FIG. 9 and FIG. 10A, the shapes of the third effective light-emitting regions 331 of the two third color sub-pixels 330 in each repeating unit 110 are the same, and the areas of the third effective light-emitting regions 331 of the two third color sub-pixels 330 in each repeating unit 110 are equal.

For example, as illustrated in FIG. 9 and FIG. 10A, the first connection line 111 extends in the first direction, and in each repeating unit 110, the third effective light-emitting regions 331 of the two third color sub-pixels 330 are symmetrically distributed with respect to the first connection line 111.

In this example, the first color sub-pixel and the second color sub-pixel are blue sub-pixel and red sub-pixel, respectively, and the third color sub-pixel is green sub-pixel. The area of the effective light-emitting region of each first color sub-pixel and the area of the effective light-emitting region of each second color sub-pixel are greater than the area of the effective light-emitting region of each third color sub-pixel. The effective light-emitting regions of the first color sub-pixel and the second color sub-pixel both overlap with the connection portion, the area of the effective light-emitting regions of the two color sub-pixels is greater, so the overlapping area between the effective light-emitting regions and the connection portion accounts for a less proportion of the effective light-emitting regions. Therefore, although the overlapping portions between the organic light-emitting layers in the effective light-emitting regions of the first color sub-pixel and the second color sub-pixel, and the connection portions will cause unevenness problems, it will not produce too obvious color deviation phenomenon. While the area of the effective light-emitting region of the third color sub-pixel is small, the overlapping area between the effective light-emitting region and the connection portion accounts for a greater proportion of the area of the effective light-emitting region. Therefore, the unevenness of the overlapping portion between the organic light-emitting layer in the effective light-emitting region of the third color sub-pixel and the connection portion will make the third color sub-pixel easy to produce obvious color deviation phenomenon.

In addition, in each repeating unit, the two third color sub-pixels are symmetrically distributed, but the overlapping portions between the connection portions and the effective light-emitting regions of the two third color sub-pixels are not symmetrically distributed relative to the first connection line. Therefore, when two third color sub-pixels in each repeating unit emit light at the same time, the light-emitting effect of the two third color sub-pixels is different because of the different relative position relationship between the connection portion and the effective light-emitting region of each third color sub-pixel, thus resulting in the image display effect.

As illustrated in FIG. 10A, in order to solve the problem that two symmetrical third color sub-pixels in each repeating unit have different light-emitting effects, in an example of the embodiment of the present disclosure, the display substrate further includes a strip-shaped portion 232, the strip-shaped portion 232 extends in the first direction, and is disposed on the same layer and made of the same material as the first power line 200. In the direction perpendicular to the base substrate 100, the third effective light-emitting region 331 overlaps with both of the strip-shaped portion 232 and the fourth connection portion 230. The strip-shaped portion 232 is located between the second sub power line 220 closest to the third effective light-emitting region 331 and the fourth connection portion 230, and the strip-shaped portion 232 and the fourth connection portion 230 are located at the same side of a straight line passing through the center of the third effective light-emitting region 331 and extending in the first direction. The above-mentioned second sub power line 220 closest to the third effective light-emitting region refers to the second sub power line 220 of the two second sub power lines 220 located at two sides of the third effective light-emitting region 331 in the first direction which has the shortest distance from the geometric center of the third effective light-emitting region.

For example, the strip-shaped portion 232 and the fourth connection portion 230 can be of an integral structure.

For example, a pad block 240 is further arranged on the side of the second electrode 333 of the third color sub-pixel 330 facing the base substrate 100, and the orthographic projection of the third effective light-emitting region 331 of the third color sub-pixel 330 on the base substrate 100 overlaps with the orthographic projection of the pad block 240 on the base substrate 100. For example, the strip-shaped portion 232 and the fourth connection portion 230 are located at one side of a straight line passing through the center of the third effective light-emitting region 331 and extending in the first direction, and the pad block 240 is located at the other side of the straight line. By arranging the pad block and the strip-shaped portion, and the pad block and the strip-shaped portion are respectively located at two opposite sides of the center of the third effective light-emitting region in the second direction, the embodiment of the present disclosure can increase the symmetry of the third effective light-emitting region in the second direction.

For example, in the direction perpendicular to the base substrate 100, the overlapping portion of each third effective light-emitting region 331 with the pad block 240 is a first overlapping portion 2341, and the overlapping portion of the third effective light-emitting region 331 with the fourth connection portion 230 and the strip-shaped portion 232 is a second overlapping portion 2342, and the area ratio of the first overlapping portion 2341 to the second overlapping portion 2342 is approximately 0.9-1.1. For example, the areas of the first overlapping portion 2341 and the second overlapping portion 2342 are approximately equal, thereby further increasing the symmetry of the third effective light-emitting region in the second direction.

For example, as illustrated in FIG. 10A, in each repeating unit, the third effective light-emitting regions 331 of two third color sub-pixels 330 are symmetrically distributed relative to the first connection line, and in the direction perpendicular to the base substrate 100, the overlapping portion of the pad block 240, the fourth connection portion 230 and the strip-shaped portion 232 with the third effective light-emitting region 331 of one third color sub-pixel is a third overlapping portion 2343. The overlapping region of the pad block 240, the fourth connection portion 230 and the strip-shaped portion 232 with the third effective light-emitting region 331 of the other third color sub-pixel is a fourth overlapping portion 2344, and the third overlapping portion 2343 and the fourth overlapping portion 2344 are approximately symmetrically distributed with respect to the first connection line. Therefore, in the case where two third color sub-pixels in each repeating unit emit light at the same time, the light-emitting effects of the two third color sub-pixels are substantially the same.

For example, as illustrated in FIG. 10A, the pad block 240 can be a portion of the first sub power line 210 overlapping with the third effective light-emitting region 331 in the direction perpendicular to the base substrate 100 to save the manufacturing process. For example, in order to make the overlapping portions where the two organic light-emitting layers 332 in the two third effective light-emitting regions 331 in each repeating unit overlap with the first sub power line 210, the strip-shaped portion 232 and the fourth connection portion 230 symmetrically distributed, the position of the strip-shaped portion 232 can be set according to the positions of the overlapping portions of the first sub power line 210 and the fourth connection portion 230 and the third effective light-emitting region 331. For example, when the pad block is a part of the first sub power line, the first sub power line includes a first sub power line with a break and a first sub power line without a break, the first sub power line with a break and the first sub power line without a break are alternately arranged in the Y direction. In addition, a first break 211 and a second break 212 are provided on the first sub power line with a break, and the first break 211 and the second break 212 are alternately arranged in the X direction.

For example, the pixel circuit of each sub-pixel includes one fourth connection portion 230, and a plurality of fourth connection portions 230 included in a plurality of sub-pixels are arranged in an array in the first direction and the second direction. For example, the plurality of fourth connection portions 230 are arranged at equal intervals in the first direction, and the plurality of fourth connection portions 230 are arranged at equal intervals in the second direction.

Of course, in the actual process, the portions where the first sub power line, the strip-shaped portion and the fourth connection portion overlap with the two third effective light-emitting regions can only be approximately symmetrically distributed. Therefore, the symmetrical distribution mentioned in the embodiments of the present disclosure refers to an approximately symmetrical distribution, for example, "approximately" can be expressed within one or more standard deviations, or within 10% or 5% of the value.

For example, as illustrated in FIG. 10A, in each repeating unit, a portion of the pad block 240 overlapping with one third effective light-emitting region 331 and a portion of the fourth connection portion 230 and the strip-shaped portion 232 overlapping with another third effective light-emitting region 331 are symmetrically distributed with respect to the first connection line.

According to the embodiment of the present disclosure, by setting the position of the strip-shaped portion according to the positional relationship between the first sub power line and the fourth connection portion and the third effective light-emitting region, in the case where two third color sub-pixels in each repeating unit emit light at the same time, they can have approximately the same light-emitting effect, so as to avoid affecting the final display effect.

For example, as illustrated in FIG. 10A, in each third color sub-pixel 330, the first overlapping portion 2341 and the second overlapping portion 2342 are centrally symmetrically distributed.

According to the embodiment of the present disclosure, the light-emitting layers in the effective light-emitting regions of two third color sub-pixels in the same repeating unit are ensured to be symmetrically distributed, and at the same time, the light-emitting layers in the effective light-emitting regions of each third color sub-pixel are also ensured to be centrally symmetrical, so as to ensure the luminous uniformity of each third color sub-pixel and improve the defects such as color deviation.

FIG. 11-FIG. 12 schematically illustrate that the first sub power line (i.e., pad block) overlapping with the third effective light-emitting region will cause uneven protrusions on the second electrode, organic light-emitting layer and other film layers in the third effective light-emitting region. By arranging strip-shaped portions in the same layer as the first sub power line, protrusions can appear at another position of the organic light-emitting layer in the third effective light-emitting region, after the two protrusions are set to be approximately equal in area or symmetrical in center, the uniformity of light-emitting of the third color sub-pixel can be ensured. The protrusions illustrated in FIG. 11-FIG. 12 are only schematic, and the edges of protrusions in actual products can be smooth curves instead of the illustrated right-angle fold lines.

Figure 10B:
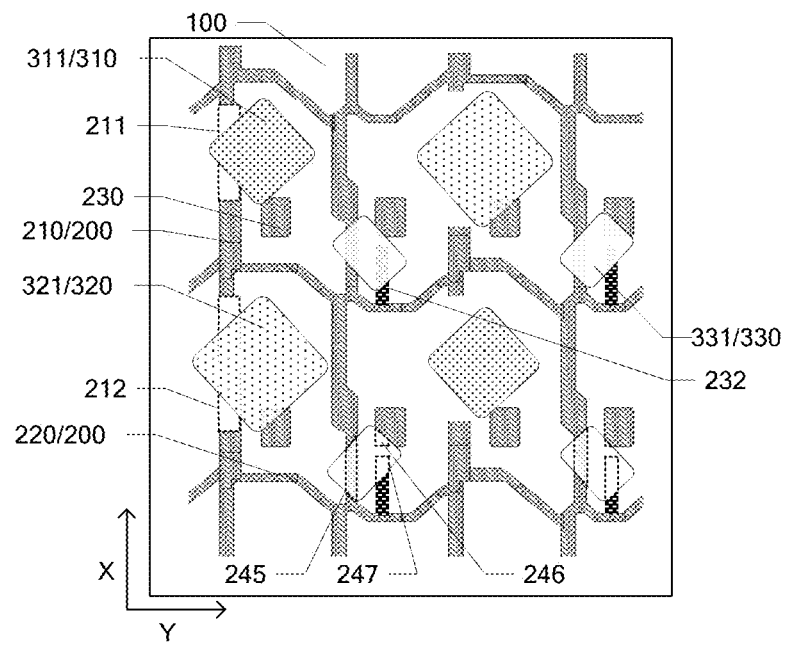
FIG. 10B is a schematic diagram of a partial planar structure of a display substrate according to another example of an embodiment of the present disclosure.

For example, FIG. 10B is a schematic diagram of a partial planar structure of a display substrate according to another example of the embodiment of the present disclosure. Different from the example illustrated in FIG. 10A, in the example illustrated in FIG. 10B, the strip-shaped portion 232 is arranged integrated with the second sub power line 220, and the strip-shaped portion 232 and the fourth connection portion 230 are arranged at intervals to prevent electrical connection between the strip-shaped portion 232 and the fourth connection portion 230, which affects the normal display of the third color sub-pixel. In the direction perpendicular to the base substrate 100, the first sub power line 210 overlaps with the third effective light-emitting region 331, the strip-shaped portion 232 and the fourth connection portion 230 are located at one side of a straight line passing through the center of the third effective light-emitting region 331 and extending in the first direction, and the first sub power line 210 is located at the other side of the straight line, which can increase the symmetry of each third effective light-emitting region in the second direction and reduce the color deviation.

For example, in the direction perpendicular to the base substrate 100, the third effective light-emitting regions 331 overlap with the first sub power line 210, the fourth connection portion 230 and the strip-shaped portion 232, and the overlapping portions of each third effective light-emitting region 331 with the first sub power line 210, the fourth connection portion 230 and the strip-shaped portion 232 are respectively the fifth overlapping portion 245, the sixth overlapping portion 246 and the seventh overlapping portion 247. The edge of the sixth overlapping portion 246 close to the fifth overlapping portion 245 and the edge of the seventh overlapping portion 247 close to the fifth overlapping portion 245 are located at the same straight line extending in the first direction.

For example, for one third color sub-pixel, the area of the fifth overlapping portion 245 can be approximately equal to the sum of the areas of the sixth overlapping portion 246 and the seventh overlapping portion 247, thereby reducing the color deviation of each third color sub-pixel.

For example, in the same repeating unit, the sixth overlapping portion 246 and the seventh overlapping portion 247 of one third color sub-pixel and the fifth overlapping portion 245 of another third color sub-pixel are substantially symmetrically distributed with respect to the first connection line 111, which can ensure that the light-emitting layers of the effective light-emitting regions of the two third color sub-pixels in the same repeating unit are symmetrically distributed, thereby reducing the difference of light-emitting effects of the two third color sub-pixels in the case where the two third color sub-pixels in each repeating unit emit light at the same time.

For example, in the same repeating unit, the areas of the sixth overlapping portion 246 and the seventh overlapping portion 247 of one third color sub-pixel are approximately equal to the area of the fifth overlapping portion 245 of another third color sub-pixel, which can ensure that when two third color sub-pixels in each repeating unit emit light at the same time, the difference of the light-emitting effects of the two third color sub-pixels can be reduced, thereby reducing the color deviation.

Embodiments of the present disclosure are not limited to that the strip-shaped portion is integrated with the fourth connection portion or the second sub power line, the strip-shaped portion can also be independent of the fourth connection portion or the second sub power line, as long as it can be ensured that the light-emitting layers of the effective light-emitting regions of the two third color sub-pixels in the same repeating unit can be symmetrically distributed, and in the case where the two third color sub-pixels in each repeating unit emit light at the same time, the difference of light-emitting effects of the two third color sub-pixels can be reduced.

Figure 10C:
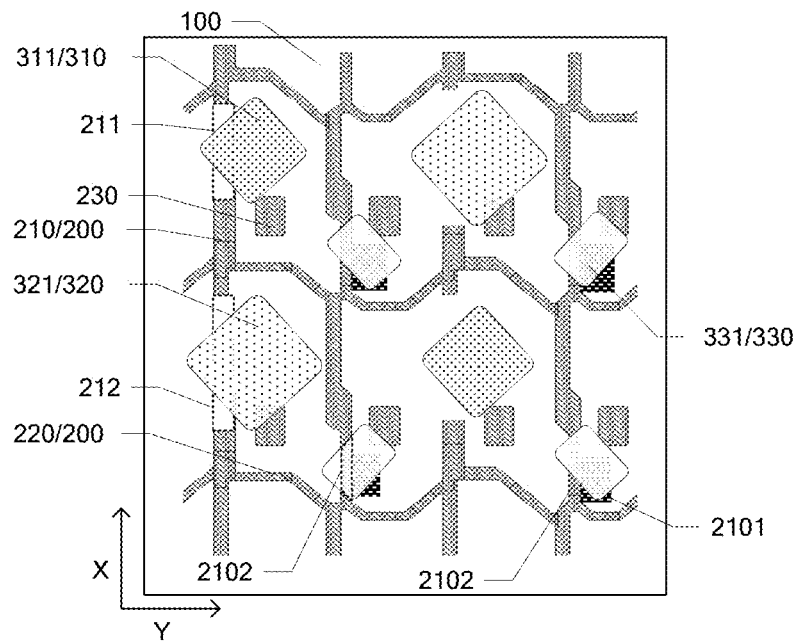
FIG. 10C is a schematic diagram of a partial planar structure of a display substrate according to another example of an embodiment of the present disclosure.

For example, FIG. 10C is a schematic diagram of a partial planar structure of a display substrate according to another example of the embodiment of the present disclosure. Different from the example illustrated in FIG. 10A, the display substrate in the example illustrated in FIG. 10C is not provided with a strip-shaped portion, and the first sub power line 210 further includes a protruding portion 2101, the protruding portion 2101 is located at a side of the first sub power line main body 2102 close to the fourth connection portion 230 connected with the third color sub-pixel 330 and between the second sub power line 220 close to the third effective light-emitting region 331 and the fourth connection portion 230. The protruding portion 2101 and the fourth connection portion 230 are arranged at intervals to prevent the protruding portion 2101 and the fourth connection portion 230 from being electrically connected to affect the normal display of the third color sub-pixel.

For example, the orthographic projection of the third effective light-emitting region 331 on the base substrate 100 overlaps with the orthographic projections of the first sub power line main body 2102, the protruding portion 2101 and the fourth connection portion 230 on the base substrate 100, and the center of the orthographic projection of the third effective light-emitting region 331 on the base substrate 100 is located within the orthographic projection of the protruding portion 2101 on the base substrate 100. That is, the orthographic projection of the straight line passing through the center of the third effective light-emitting region 331 and extending in the first direction on the base substrate 100 overlaps with the orthographic projection of the protruding portion 2101 on the base substrate 100, so that the symmetry of each third effective light-emitting region in the second direction can be increased and the color deviation can be reduced.

Another embodiment of the present disclosure provides a display device including any one of the above-mentioned display substrates. In the display device in the embodiment of the present disclosure, by setting the first break on the first power line so that the first effective light-emitting region of the first color sub-pixel does not overlap or partially overlaps with the first power line, the problem of color deviation of the first color sub-pixel in the display process can be improved.

For example, the display device can be a display device such as an organic light-emitting diode display device, and any product or component including the display device and having display function such as a television, a digital camera, a mobile phone, a watch, a tablet computer, a notebook computer, a navigator, etc. This embodiment is not limited thereto.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

The foregoing is merely exemplary embodiments of the present disclosure, but is not used to limit the protection scope of the present disclosure. The protection scope of the present disclosure shall be defined by the attached claims.

The invention claimed is:

1. A display substrate, comprising:
   a base substrate;
   a first power line located on the base substrate, the first power line comprising a plurality of first sub power lines extending in a first direction and a plurality of second sub power lines located between every two adjacent first sub power lines, the second sub power line being configured to connect two adjacent first sub power lines;
   a pixel defining layer located at a side of the first power line away from the base substrate, the pixel defining layer comprising a plurality of openings to define effective light-emitting regions of a plurality of sub-pixels, the plurality of sub-pixels comprising a first color sub-pixel, and the first color sub-pixel comprising a first effective light-emitting region;
   wherein at least one of the first sub power lines comprises at least one first break, and a part of the first effective light-emitting region is located at the at least one first break so that the first sub power line does not pass through the first effective light-emitting region in the first direction;

the plurality of sub-pixels further comprise a second color sub-pixel and a third color sub-pixel, the second color sub-pixel comprises a second effective light-emitting region, and the third color sub-pixel comprises a third effective light-emitting region;

the display substrate further comprising: a connection portion arranged in the same layer and made of the same material as the first power line; a strip-shaped portion, extending in the first direction, disposed in the same layer and made of the same material as the first power line;

wherein, in a direction perpendicular to the base substrate, the third effective light-emitting region overlaps with both of the strip-shaped portion and the connection portion, the strip-shaped portion and the connection portion are arranged in the first direction;

in the direction perpendicular to the base substrate, the first sub power line overlaps with the third effective light-emitting region, a portion of the first sub-power line overlapping with the third effective light-emitting region comprises a pad block extending along the first direction, the strip-shaped portion and the connection portion are located at one side of a straight line passing through a center of the third effective light-emitting region and extending in the first direction, and the first sub power line is located at the other side of the straight line, orthogonal projections of the pad block and the strip-shaped portion on the straight line overlap;

in the direction perpendicular to the base substrate, a portion of each third effective light-emitting region overlapping with the pad block is a first overlapping portion, and a portion of the third effective light-emitting region overlapping with the connection portion and the strip-shaped portion is a second overlapping portion, and an area ratio of the first overlapping portion to the second overlapping portion is approximately 0.9-1.1.

2. The display substrate according to claim 1, further comprising:

a plurality of second power lines extending in the first direction and located at a side of the first power lines close to the base substrate, wherein the second power line is connected with the first power line through a via hole in an insulating layer between the first power line and the second power line.

3. The display substrate according to claim 2, wherein at least one of the first sub power lines comprises at least one second break, and a part of the second effective light-emitting region is located at the at least one second break so that the first sub power line does not pass through the second effective light-emitting region in the first direction.

4. The display substrate according to claim 3, wherein, in a direction perpendicular to the base substrate, the second effective light-emitting region does not substantially overlap with the first sub power line having the second break.

5. The display substrate according to claim 3, wherein one of the first color sub-pixel and the second color sub-pixel is a blue sub-pixel, and the other is a red sub-pixel.

6. The display substrate according to claim 3, wherein the plurality of sub-pixels are divided into a plurality of repeating units, each of the plurality of repeating units comprises the first color sub-pixel, the second color sub-pixel and two third color sub-pixels, in each of the plurality of repeating units, the first color sub-pixel and the second color sub-pixel are arranged in the first direction, and two third color sub-pixels are arranged in a second direction intersecting with the first direction, and a line connecting a center of the first color sub-pixel and a center of the second sub-pixel is a first connection line, a line connecting centers of the two third color sub-pixels is a second connection line, the first connection line intersects with the second connection line, the plurality of repeating units are arranged in the second direction to form a plurality of repeating unit groups, the plurality of repeating unit groups are arranged in the first direction, and adjacent repeating unit groups among the plurality of repeating unit groups are shifted with each other in the second direction.

7. The display substrate according to claim 6, wherein the third color sub-pixel comprises a first electrode, an organic light-emitting layer and a second electrode which are sequentially stacked, the second electrode is located at a side of the organic light-emitting layer facing the base substrate and is electrically connected with the connection portion.

8. The display substrate according to claim 7, wherein the strip-shaped portion is located between the second sub power line close to the third effective light-emitting region and the connection portion.

9. The display substrate according to claim 8, wherein, in each repeating unit, the third effective light-emitting regions of two third color sub-pixels are symmetrically distributed relative to the first connection line, and in the direction perpendicular to the base substrate, an overlapping portion of all of the pad block, the connection portion and the strip-shaped portion with the third effective light-emitting region of one third color sub-pixel is a third overlapping portion, an overlapping portion of all of the pad block, the connection portion and the strip-shaped portion with the third effective light-emitting region of another third color sub-pixel is a fourth overlapping portion, and the third overlapping portion and the fourth overlapping portion are approximately symmetrically distributed relative to the first connection line.

10. The display substrate according to claim 8, wherein the second sub power line and the strip-shaped portion are of an integrated structure, and the strip-shaped portion and the connection portion are arranged at intervals.

11. The display substrate according to claim 8, wherein the connection portion and the strip-shaped portion are of an integral structure.

12. The display substrate according to claim 1, wherein, in each third color sub-pixel, the first overlapping portion and the second overlapping portion are centrally symmetrically distributed.

13. The display substrate according to claim 1, wherein an orthographic projection of the effective light-emitting region of each sub-pixel on the base substrate does not overlap with an orthographic projection of the second sub power line on the base substrate.

14. A display device comprising the display substrate according to claim 1.

15. A display substrate comprising:
a base substrate;
an active semiconductor layer on the base substrate;
a first insulating layer located at a side of the active semiconductor layer away from the base substrate;

a first conductive layer located at a side of the first insulating layer away from the active semiconductor layer;
a second insulating layer located at a side of the first conductive layer away from the first insulating layer;
a second conductive layer located at a side of the second insulating layer away from the first conductive layer;
a third insulating layer located at a side of the second conductive layer away from the second insulating layer;
a third conductive layer located at a side of the third insulating layer away from the second conductive layer;
a fourth insulating layer located at a side of the third conductive layer away from the third insulating layer;
a fourth conductive layer located at a side of the fourth insulating layer away from the third conductive layer, wherein the fourth conductive layer comprises a first power line, the first power line comprises a plurality of first sub power lines extending in a first direction and a plurality of second sub power lines located between every two adjacent first sub power lines, the second sub power line is configured to connect two adjacent first sub power lines, and the third conductive layer comprises a plurality of second power lines extending in the first direction; and
a pixel defining layer located at a side of the first power line away from the base substrate, the pixel defining layer comprising a plurality of openings to define effective light-emitting regions of a plurality of sub-pixels, the plurality of sub-pixels comprising a first color sub-pixel, and the first color sub-pixel comprising a first effective light-emitting region;
wherein at least one of the first sub power lines comprises at least one first break, and a part of the first effective light-emitting region is located at the at least one first break so that the first sub power line does not pass through the first effective light-emitting region in the first direction;
at least one first sub power line comprises two parts located on both sides of a same first break in the first direction, a straight line extending in the first direction passes through the two parts, ends of the two parts which are close to each other are not connected, and two different second sub power lines respectively connected with the two parts are connected through another first sub power line;
the plurality of sub-pixels further comprise a second color sub-pixel and a third color sub-pixel, the second color sub-pixel comprises a second effective light-emitting region, and the third color sub-pixel comprises a third effective light-emitting region;
the display substrate further comprising: a connection portion arranged in the same layer and made of the same material as the first power line; a strip-shaped portion, extending in the first direction, disposed in the same layer and made of the same material as the first power line; wherein, in a direction perpendicular to the base substrate, the third effective light-emitting region overlaps with both of the strip-shaped portion and the connection portion, the strip-shaped portion and the connection portion are arranged in the first direction,
in the direction perpendicular to the base substrate, the first sub power line overlaps with the third effective light-emitting region, a portion of the first sub-power line overlapping with the third effective light-emitting region comprises a pad block extending along the first direction, the strip-shaped portion and the connection portion are located at one side of a straight line passing through a center of the third effective light-emitting region and extending in the first direction, and the first sub power line is located at the other side of the straight line, orthogonal projections of the pad block and the strip-shaped portion on the straight line overlap;
in the direction perpendicular to the base substrate, a portion of each third effective light-emitting region overlapping with the pad block is a first overlapping portion, and a portion of the third effective light-emitting region overlapping with the connection portion and the strip-shaped portion is a second overlapping portion, and an area ratio of the first overlapping portion to the second overlapping portion is approximately 0.9-1.1.

* * * * *